United States Patent
Sakurai et al.

(10) Patent No.: US 6,714,087 B2
(45) Date of Patent: Mar. 30, 2004

(54) VOLTAGE CONTROLLED OSCILLATION CIRCUIT HAVING EASILY CONTROLLABLE OSCILLATION CHARACTERISTIC AND CAPABLE OF GENERATING HIGH FREQUENCY AND LOW FREQUENCY INTERNAL CLOCKS

(75) Inventors: Tomohiro Sakurai, Hyogo (JP); Kouichi Ishimi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/122,233

(22) Filed: Apr. 16, 2002

(65) Prior Publication Data

US 2003/0090330 A1 May 15, 2003

(30) Foreign Application Priority Data

Nov. 15, 2001 (JP) .......................... 2001-350291

(51) Int. Cl.$^7$ ............................. H03B 27/00; H03B 5/02
(52) U.S. Cl. ................... 331/57; 331/177 R; 331/34
(58) Field of Search ............................. 331/57, 177 R, 331/34, 17, 179

(56) References Cited

U.S. PATENT DOCUMENTS

| 6,072,372 A | * | 6/2000 | Yokoyama | ................. 331/57 |
| 6,188,285 B1 | * | 2/2001 | Nakanishi et al. | ............ 331/2 |
| 6,404,294 B1 | * | 6/2002 | Sha et al. | .................... 331/57 |
| 6,472,944 B2 | * | 10/2002 | Soda | ......................... 331/57 |
| 2002/0041215 A1 | * | 4/2002 | Kiyose | ...................... 331/57 |

FOREIGN PATENT DOCUMENTS

| JP | 3-259619 | 11/1991 |
| JP | 5-102801 | 4/1993 |
| JP | 5-327424 | 12/1993 |
| JP | 7-58602 | 3/1995 |
| JP | 7-74596 | 3/1995 |

OTHER PUBLICATIONS

Neil H. E. Weste and Kamran Eshraghian, Principles of CMOS VLSI Design: A Systems Perspective, 2$^{nd}$ Ed., 1993, pp. 334–336, Addison–Wesley, Reading, MA (in The VLSI Systems Series 1993, ed. Lynn Conway and Charles Seitz).

* cited by examiner

Primary Examiner—Robert Pascal
Assistant Examiner—Joseph Chang
(74) Attorney, Agent, or Firm—Burns, Doane, Swecker & Mathis, L.L.P.

(57) ABSTRACT

A current mirror circuit consisting of two P-channel MOS transistors in an operating current control section controls an operating current of a ring oscillator circuit in accordance with a current value of a constant current flowing in the current mirror circuit. A control voltage input section and a first current mirror resistance section in the operating current control section control the current value of the constant current generated by the current mirror circuit in accordance with a control voltage, and changes a range in which the constant current value is changed in response to a change of the control voltage, in accordance with a control signal.

20 Claims, 22 Drawing Sheets

VOLTAGE CONTROLLED OSCILLATION CIRCUIT HAVING EASILY CONTROLLABLE OSCILLATION CHARACTERISTIC AND CAPABLE OF GENERATING HIGH FREQUENCY AND LOW FREQUENCY INTERNAL CLOCKS

BACKGROUND OF THE INVENTION

1. Field of the Invention

The present invention relates to a configuration of a voltage controlled oscillation circuit capable of variably controlling an oscillation frequency in accordance with a level of an externally applied voltage.

2. Description of the Background Art

In a large scale integrated circuit (referred to as "LSI" hereinafter), a clock generation circuit or the like which generates an internal clock signal synchronous with an external clock signal inside the LSI is often mounted so as to operate the internal circuit of the LSI synchronously with a clock applied from a system.

For such a clock generation circuit, a configuration in which an oscillation frequency of a self-excited oscillation type ring oscillator circuit is controlled so as to synchronize a phase of the oscillation output of this ring oscillator circuit with a phase of the external clock signal is sometimes employed. In order to allow the ring oscillator circuit to perform an oscillation operation while controlling the oscillation frequency of the ring oscillator circuit so as to synchronize the phase of the oscillation output of this ring oscillator circuit with the phase of the external clock signal, a so-called voltage controlled oscillation circuit (referred to as "VCO circuit" hereinafter) is employed.

FIG. 20 is a circuit diagram for describing a configuration of a conventional VCO circuit 8000.

VCO circuit 8000 is provided with an operating current control section 8100 which controls an operating current value in accordance with an external control voltage VIN, and a ring oscillator circuit 8200 which performs a self-excited oscillation operation with an operation current controlled by operation current control section 8100.

Operating current control section 8100 is provided with a P-channel MOS transistor TP01, an N-channel MOS transistor TN01 and a resistor R1 which are connected in series between a power supply potential Vcc and a ground potential GND, and a P-channel MOS transistor TP02 and an N-channel MOS transistor TN02 which are connected in series between power supply potential Vcc and ground potential GND.

A gate of transistor TP01 is connected to a gate of transistor TP02, and the gate of transistor TP01 is coupled to a drain of transistor TP01. Therefore, transistors TP01 and TP02 operate as a current mirror circuit. In addition, transistor TN01 receives control voltage VIN.

Operating current control section 8100 is further provided with a resistor R0 which is provided between the gate of transistor TP01 and ground potential GND.

On the other hand, ring oscillator circuit 8200 includes odd stages of inverters, e.g., three stages of inverters INV1 to INV3.

An output of inverter INV3 is applied to an input of inverter INV1 and cascaded inverters INV1 to INV3 perform self-excited oscillation operation.

Inverter INV1 is provided with a P-channel MOS transistor TP11, a P-channel MOS transistor TP12, an N-channel MOS transistor TN12 and an N-channel MOS transistor TNN11 which are connected in series between power supply potential Vcc and ground potential GND. A gate of transistor TP11 is coupled to a wiring LPV which is coupled to the gate of transistor TP01 (and the gate of transistor TP02). On the other hand, a gate of transistor TN11 is coupled to a wiring LNV which is coupled to the gate of transistor TN02. A gate of transistor TP12 is coupled to a gate of transistor TN12 and the output of inverter INV3 is applied to a coupling node thereof.

Inverter INV2 is provided with a P-channel MOS transistor TP21, a P-channel MOS transistor TP22, an N-channel MOS transistor TN22 and an N-channel MOS transistor TN21 which are connected in series between power supply potential Vcc and ground potential GND. A gate of transistor TP21 is coupled to wiring LPV. A gate of transistor TP22 and a gate of transistor TN22 are coupled to each other and receive a potential of an output node of inverter INV1. A gate of transistor TN21 is coupled to wiring LNV.

Inverter INV3 is provided with a P-channel MOS transistor TP31, a P-channel MOS transistor TP32, an N-channel MOS transistor TN32 and an N-channel MOS transistor TN31 which are connected in series between power supply potential Vcc and ground potential GND. A gate of transistor TP31 is coupled to wiring LPV. A gate of transistor TP32 and a gate of transistor TN32 are coupled to each other and receive a potential of an output node of inverter INV2. A gate of transistor TN31 is coupled to wiring LNV. The coupling node coupling transistor TP32 to transistor TN32 is an output node of inverter INV3 and this output node is connected to an input of inverter INV1. A potential of an output node of inverter INV3 is applied as an VCO output to the outside of VCO circuit 8000.

FIG. 21 is a graph showing the relationship between control voltage VIN of VCO circuit 8000 shown in FIG. 20 and an output clock frequency f (which relationship will be referred to as "VCO characteristic" hereinafter).

According to the characteristic shown in FIG. 21, VCO circuit 8000 is designed to serve to, for example, output a high frequency clock. The frequency characteristic of VCO circuit 8000 is expressed by a curve CA in FIG. 21. According to characteristic curve CA of VCO circuit 8000, VCO circuit 8000 outputs an arbitrary frequency between a minimum oscillation frequency fmin and a maximum oscillation frequency fmax, e.g., a frequency f1, to the outside of VCO circuit 8000 as a VCO output.

With the configuration of VCO circuit 8000, however, the frequency of the VCO output can be used as an oscillation frequency only within a determined frequency range (frequencies fmin to fmax). If VCO circuit 8000 oscillates with a low frequency of not more than minimum oscillation frequency fmin, in particular, the characteristic of VCO circuit 8000 disadvantageously becomes unstable. It is noted that an internal clock with such a relatively low frequency is necessary for LSI which generates an internal clock signal using a phased locked loop circuit (PLL circuit) including a VCO circuit to operate in, for example, a low consumption power operation mode.

Therefore, if an internal clock which oscillates with a frequency of not more than minimum oscillation frequency fmin, e.g., a frequency f2, it is necessary to separately provide another VCO circuit having a VCO characteristic expressed by a curve CB in FIG. 21.

Conventionally, therefore, it is disadvantageously difficult for one VCO circuit to simultaneously obtain a high frequency clock with frequency f1 shown in FIG. 21 and a low frequency clock with frequency f2 shown in FIG. 21.

To solve the above-mentioned disadvantages, Japanese Patent Laying-Open Nos. 7-74596, 3-259619 and 5-102801 disclose VCO circuits capable of controlling an oscillation frequency range more widely by setting the number of the stages of a ring oscillator circuit to be variable.

However, even these VCO circuits having the configurations described above have a disadvantage in that a circuit scale becomes relatively large so as to set the number of oscillation stages of the ring oscillator to be variable in an oscillation frequency region from low to high frequencies.

SUMMARY OF THE INVENTION

It is an object of the present invention to provide a voltage controlled oscillation circuit which has an easily controllable voltage controlled oscillation characteristic, and which can generate a high frequency internal clock and a low frequency internal clock while suppressing a circuit scale.

It is another object of the present invention to provide a voltage controlled oscillation circuit which enables a high frequency clock for high speed operation and a low frequency clock for a low consumption power operation to be outputted by one voltage controlled oscillation circuit.

In short, the present invention provides a voltage controlled oscillation circuit which is provided with a self-excited oscillation circuit and an operating current control circuit.

The self-excited oscillation circuit oscillates with a frequency in accordance with a level of an operating current control signal. The self-excited oscillation circuit includes a plurality of stages of inversion circuits connected in series, each having a field effect transistor as a switching element, and operating with a current in accordance with the operating current control signal. The operating current control circuit generates the operating current control signal in accordance with a control voltage applied from an outside of the voltage controlled oscillation circuit. The operating current control circuit includes a current mirror circuit and a current mirror control circuit. The current mirror circuit generates a constant current flowing from a first power supply node to a second power supply node, and outputs the operating current control signal in accordance with a value of the constant current. The current mirror control circuit controls the value of the constant current generated by the current mirror circuit in accordance with the control voltage, and changes a range, in which the value of the constant current is changed in response to a change of the control voltage, in accordance with an instruction signal applied from the outside of the voltage controlled oscillation circuit.

Therefore, the present invention has an advantage in that even if an internal clock with a high frequency is generated or an internal clock with a low frequency is generated, it is possible to generate a stable internal clock by using one voltage controlled oscillation circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

First Embodiment

Figure 1:
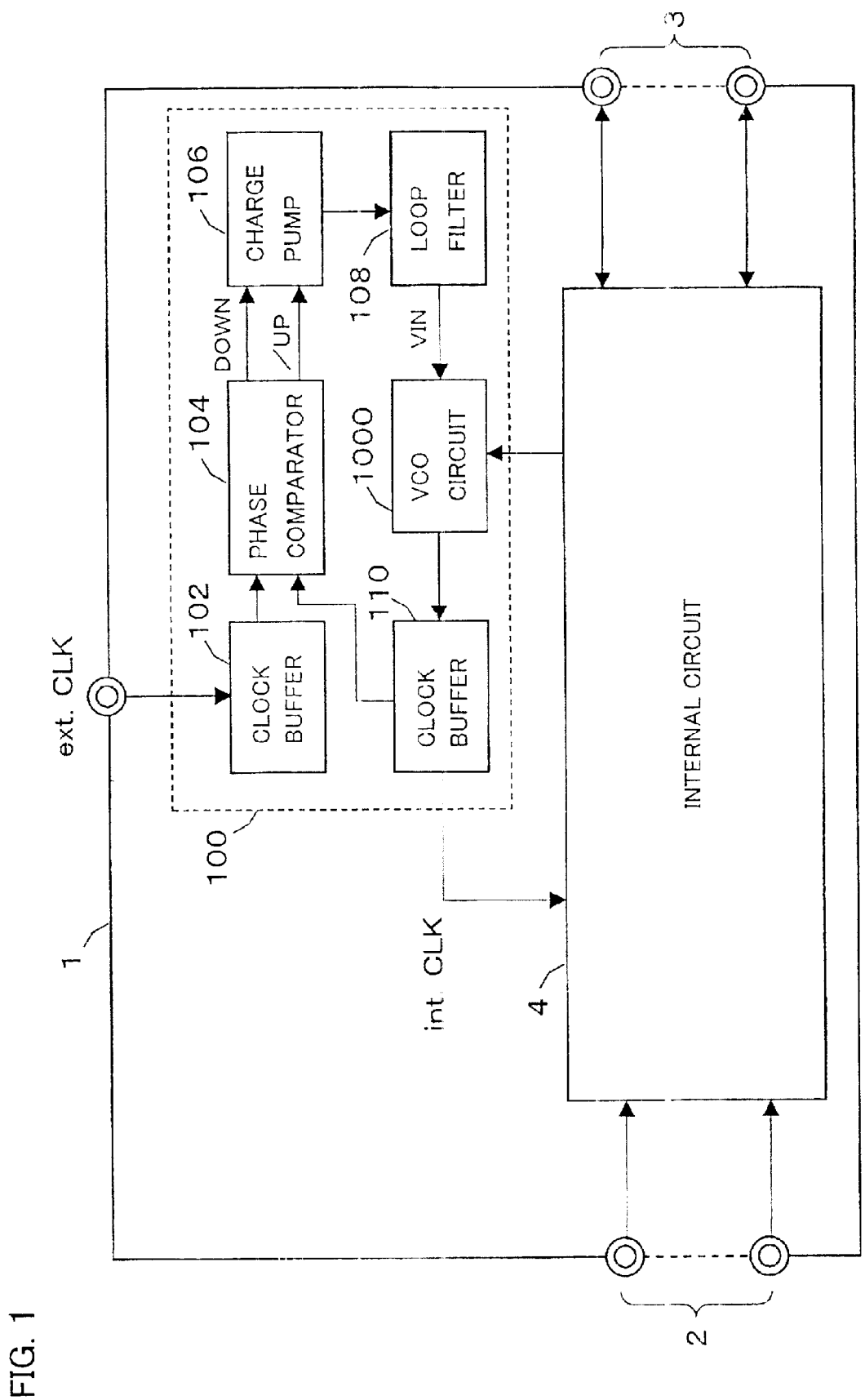
FIG. 1 is a schematic block diagram for describing a configuration of a semiconductor integrated circuit device 1 on which an internal clock generation circuit 100 is mounted.

FIG. 1 is a schematic block diagram for describing a configuration of a semiconductor integrated circuit device 1 on which an internal clock generation circuit 100 is mounted.

Referring to FIG. 1, semiconductor integrated circuit device 1 is provided with control signal input terminals 2 for applying a control signal from an outside of semiconductor integrated circuit device 1 to an internal circuit 4 which performs a predetermined operation processing and the like, data input and output terminals 3 for transmitting and receiving data between internal circuit 4 and the outside of semiconductor integrated circuit device 1, and an internal clock generation circuit 100. As will be described later, internal circuit 4 outputs a control signal for controlling an oscillation frequency of an internal clock signal int.CLK outputted from internal clock generation circuit 100 to internal clock generation circuit 100.

Internal clock generation circuit 100 is provided with a clock buffer 102 which receives an external clock signal ext.CLK, and a phase comparator 104 which receives internal clock signal int.CLK and an output of clock buffer 102 to compare a phase of internal clock signal int.CLK with a phase of the output of clock buffer 102, and which activates one of a signal DOWN and a signal/UP depending on whether the frequency of internal clock signal int.CLK is higher or lower than the frequency of the signal applied from clock buffer 102. Internal clock generation circuit 100 is further provided with a charge pumping circuit 106 which receives signals/UP and DOWN from phase comparator 104 to perform a charge pumping operation, and a loop filter 108 which converts an output of charge pumping circuit 106 into an control voltage VIN.

VCO circuit 1000 oscillates with a frequency according to control voltage VIN from loop filter 108. A clock buffer 110 receives the output of VCO circuit 1000 and outputs a result subjected to a buffering process as internal clock signal int.CLK.

Figure 2:
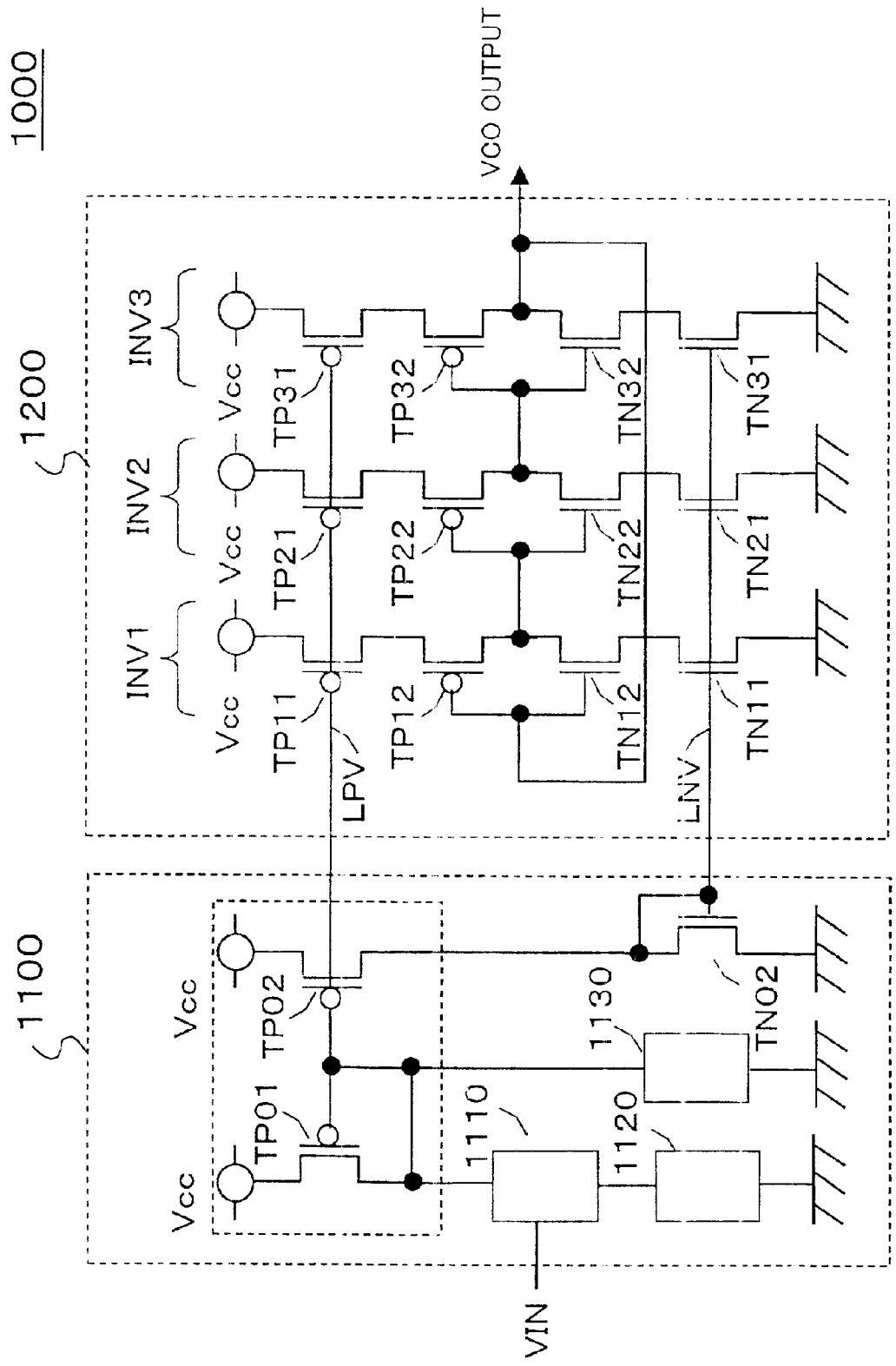
FIG. 2 is a circuit diagram for describing a configuration of a VCO circuit 1000 shown in FIG. 1.

FIG. 2 is a circuit diagram for describing a configuration of VCO circuit 1000 shown in FIG. 1.

Referring to FIG. 2, VCO circuit 1000 is provided with an operating current control section 1100 and a ring oscillator circuit 1200.

Figure 20:
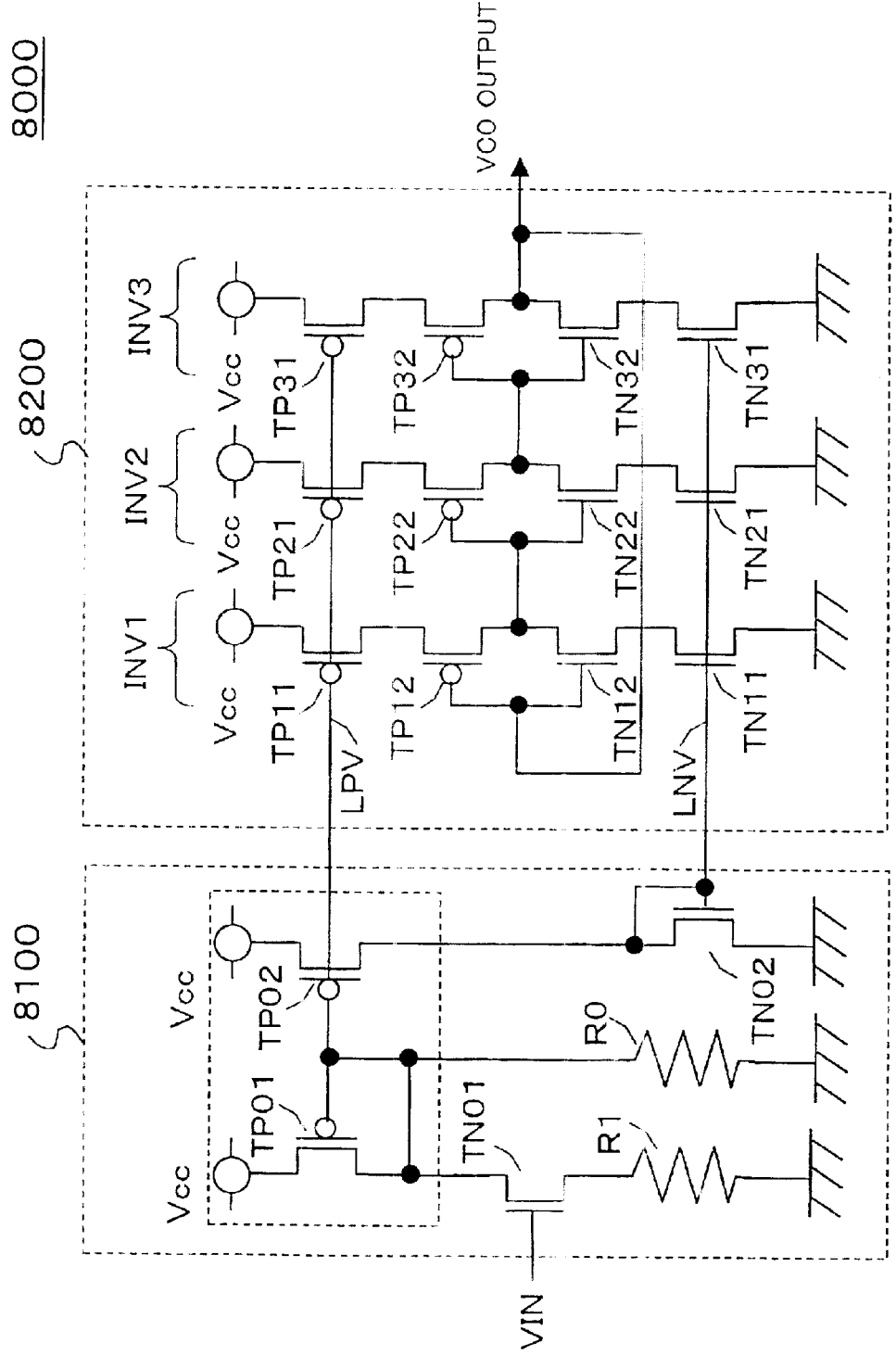
FIG. 20 is a circuit diagram for describing a configuration of a conventional VCO circuit 8000.
Figure 21:
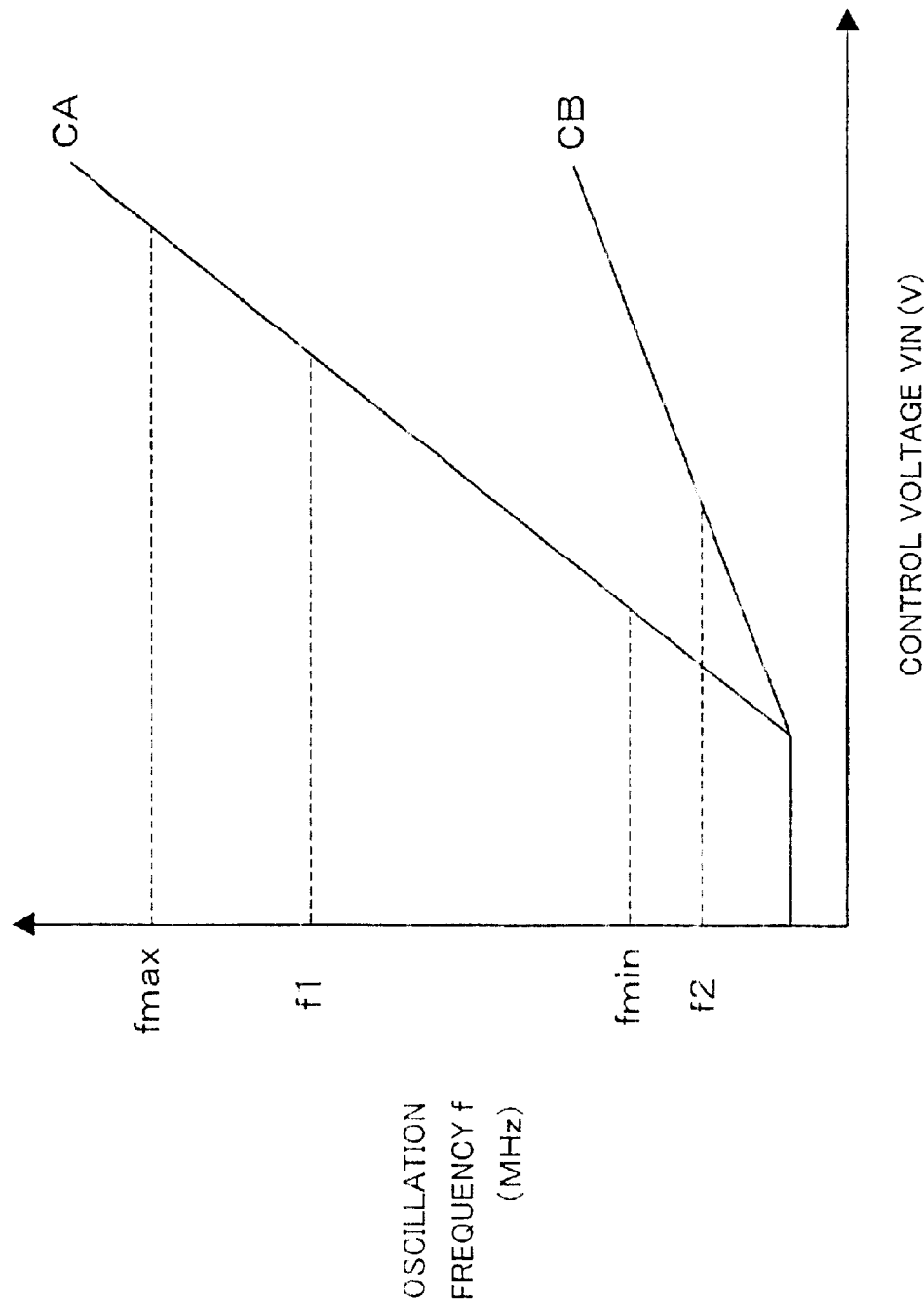
FIG. 21 is a graph showing the relationship between a control voltage VIN of VCO circuit 8000 and an output clock frequency f.

Since ring oscillator circuit 1200 has a same configuration as that of a ring oscillator circuit 8200 shown in FIG. 20, the same constituent elements are denoted by the same reference symbols shown in FIG. 20 and will not be repeatedly described herein.

On the other hand, operating current control section 1100 is provided with a P-channel MOS transistor TP01, a control voltage input section 1110 receiving control voltage VIN and a first current mirror resistance section 1120 which are connected in series between a power supply potential Vcc and a ground potential GND.

Operating current control section 1100 is further provided with a P-channel MOS transistor TP02 and an N-channel MOS transistor TN02 which are connected in series between power supply potential Vcc and ground potential GND. A gate of transistor TP01 is connected to a gate of transistor TP02, and the gate of transistor TP01 is coupled to a drain of transistor TP01. Therefore, in operating current control section 1100, transistors TP01 and TP02 form a pair and constitute a current mirror circuit.

Operating current control section 1100 is further provided with a second current mirror resistance section 1130 which is provided between the gate of transistor TP01 and ground potential GND.

Figure 3:
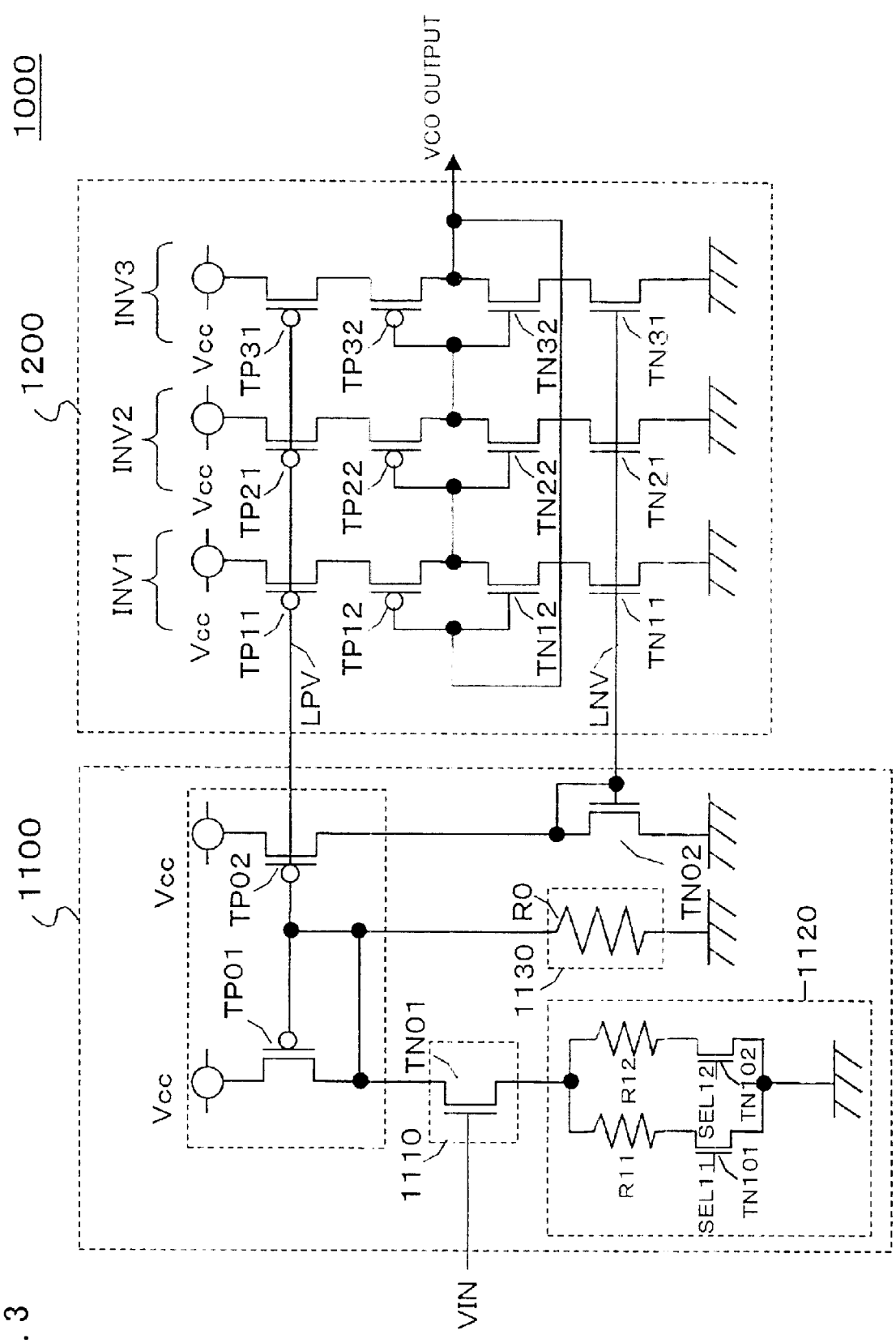
FIG. 3 is a circuit diagram for describing a configuration example of VCO circuit 1000 in more detail.

FIG. 3 is a circuit diagram for describing one configuration example of VCO circuit 1000 shown in FIG. 2 in more detail.

In FIG. 3, control voltage input section 1110 includes an N-channel MOS transistor TN01 which is provided between first current mirror resistance section 1120 and the drain of transistor TP01. A gate of transistor TN01 receives control voltage VIN.

On the other hand, first current mirror resistance section 1120 includes a resistor R11 and an N-channel MOS transistor TN101 which are connected in series between a source of transistor TN01 and ground potential GND. First current mirror resistance section 1120 also includes a resistor R12 and an N-channel MOS transistor TN102 which are connected in series between the source of transistor TN01 and ground potential GND.

A gate of transistor TN101 receives a control signal SEL11 and a gate of transistor TN102 receives a control signal SEL12. As described above, although control signals SEL11 and SEL12 are not limited thereto, it is assumed herein that control signals SEL11 and SEL12 are applied from internal circuit 4 to internal clock generation circuit 100 based on an instruction from, for example, the outside of semiconductor integrated circuit device 1.

Further, second current mirror resistance section 1130 includes a resistor R0 which is provided between the gate of transistor TP01 and ground potential GND.

According to the configuration of VCO circuit 1000 which is provided with control voltage input section 1110 and first current mirror resistance section 1120 shown in FIG. 3, therefore, the resistor for applying a current from the source of transistor TN01 to ground potential can be changed to resistor R11 or R12 in accordance with levels of control signals SEL11 and SEL12.

It is assumed herein that the resistance value of resistor R11 is lower than that of resistor R12.

Figure 4:
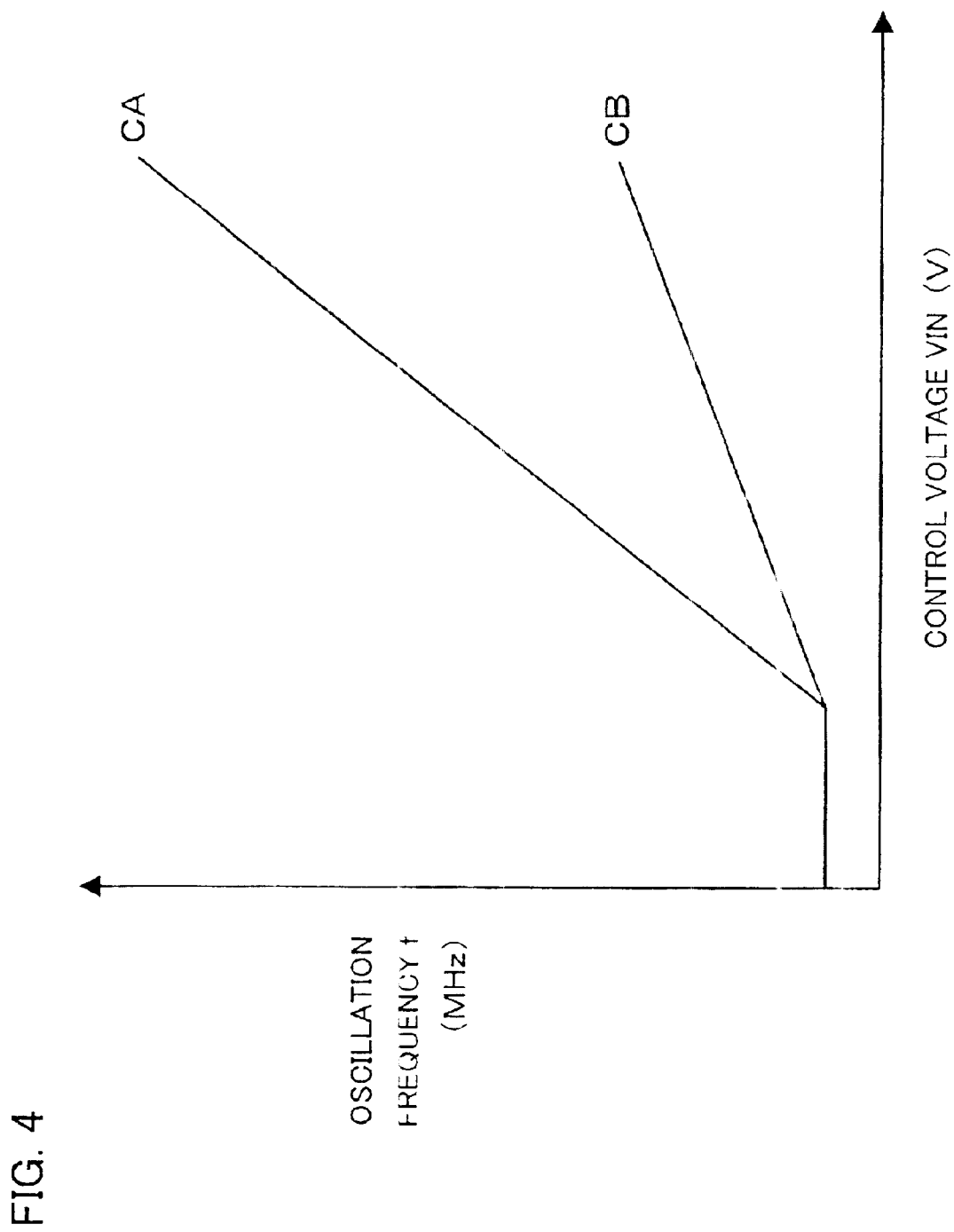
FIG. 4 is a graph showing a VCO characteristic of VCO circuit 1000 shown in FIG. 3.

FIG. 4 is a graph showing a VCO characteristic of VCO circuit 1000.

If control signal SEL11 is in an active state, control signal SEL12 is in an inactive state and the source of transistor TN01 is connected to ground potential GND through resistor R11, a current value of a current flowing in the current mirror circuit consisting of transistors TP01 and TP02 increases. Due to this, the VCO characteristic of VCO circuit 1000 is expressed by a curve CA shown in FIG. 4 and suited to generate an internal clock with a higher frequency.

On the other hand, if control signal SEL11 is in the inactive state, control signal SEL12 is in the active state and the source of transistor TN01 is coupled to ground potential GND through resistor R12, the current value of the current flowing in the current mirror circuit consisting of transistors TP01 and TP02 decreases. Due to this, the VCO characteristic of VCO circuit 1000 is expressed by a curve CB shown in FIG. 4 and suited to generate an internal clock with a lower oscillation frequency.

By thus constituting VCO circuit 1000, even if an internal clock with a high frequency or an internal clock with a low frequency is generated, it is possible to generate a stable internal clock by using one VCO circuit 1000.

As a result, even if semiconductor integrated circuit device 1 on which VCO circuit 1000 is mounted operates in a low consumption power mode, it is possible to realize the stable operation of semiconductor integrated circuit 1.

Second Embodiment

Figure 5:
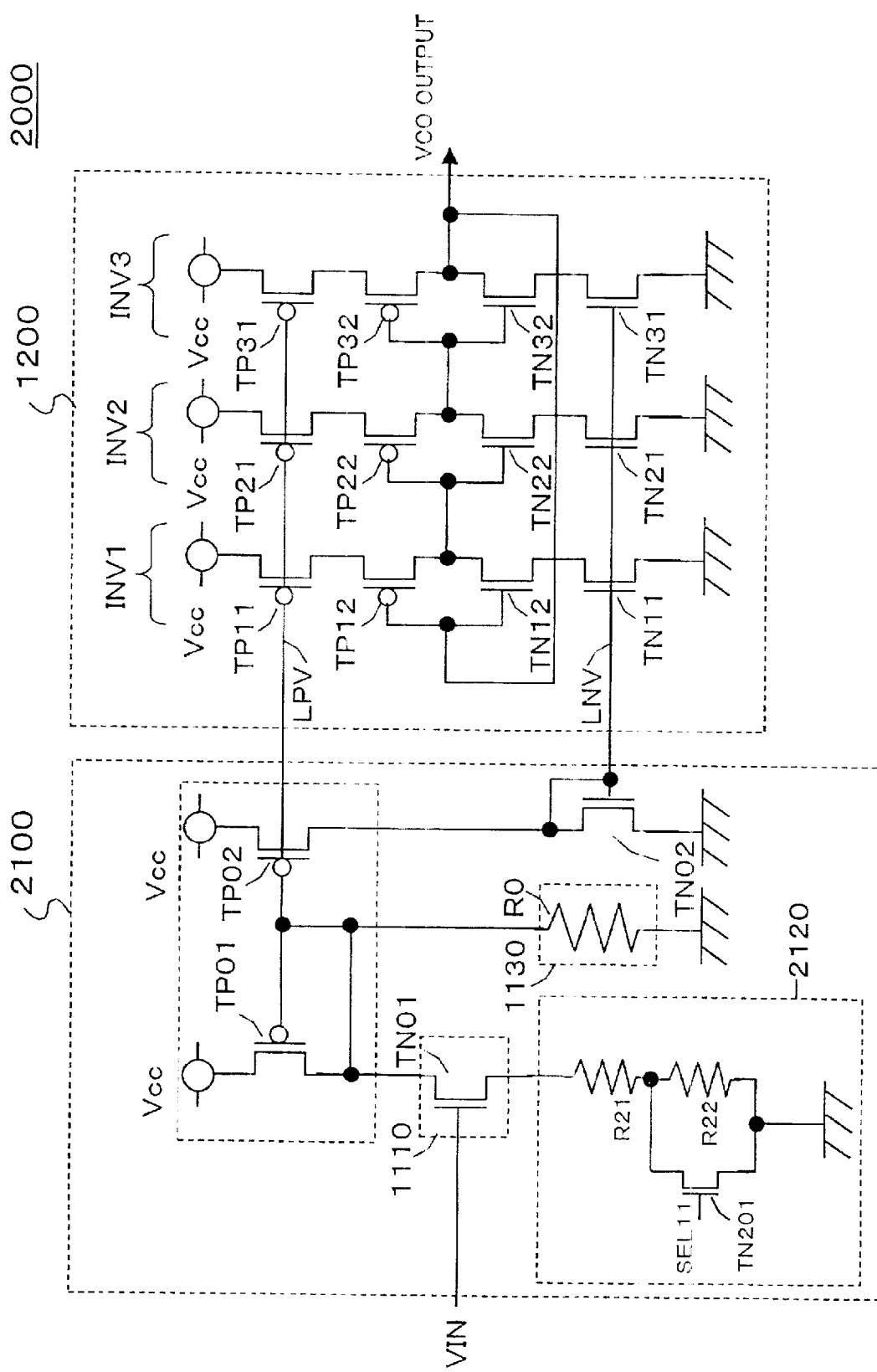
FIG. 5 is a circuit diagram for describing a configuration of a VCO circuit 2000 in a second embodiment according to the present invention.

FIG. 5 is a circuit diagram for describing a configuration of a VCO circuit 2000 in a second embodiment according to the present invention.

That is, VCO circuit 2000 can be used in place of a VCO circuit 1000 described with reference to FIGS. 2 and 3.

The configuration of VCO circuit 2000 differs from that of VCO circuit 1000 shown in FIG. 3 in the following respects.

In VCO circuit 2000, a first current mirror resistance section 2120 is provided in place of a first current mirror resistance section 1120 in a configuration of VCO circuit 1000 shown in FIG. 3.

Since remaining constituent elements of VCO circuit 2000 are the same as those of VCO circuit 1000 described with reference to FIG. 3, the same elements are denoted by the same reference symbols as those in FIG. 3 and will not be repeatedly described herein.

Referring to FIG. 5, first current mirror resistance section 2120 includes resistors R21 and R22 which are connected in series between a source of a transistor TN01 and a ground potential GND, and an N-channel MOS transistor TN201 which is connected between a connection node connecting resistors R21 and R22 and ground potential GND. A gate of transistor TN201 receives a control signal SEL11.

Namely, according to the configuration of VCO circuit 2000 shown in FIG. 5, if control signal SEL11 is in an active state and transistor TN201 is in a conductive state, the source of transistor TN01 is coupled to ground potential GND through a lower resistance than that if signal SEL11 is in an inactive state.

In this case, therefore, if control signal SEL11 is in the active state, a VCO characteristic of VCO circuit 2000 is expressed by a curve CA shown in FIG. 4. On the other hand, if control signal SEL11 is in the inactive state, the VCO characteristic of VCO circuit 2000 is expressed by a curve CB shown in FIG. 4.

Accordingly, even with the configuration shown in FIG. 5, VCO circuit 2000 exhibits the same advantage as that of VCO circuit 1000 in the first embodiment.

Third Embodiment

Figure 6:
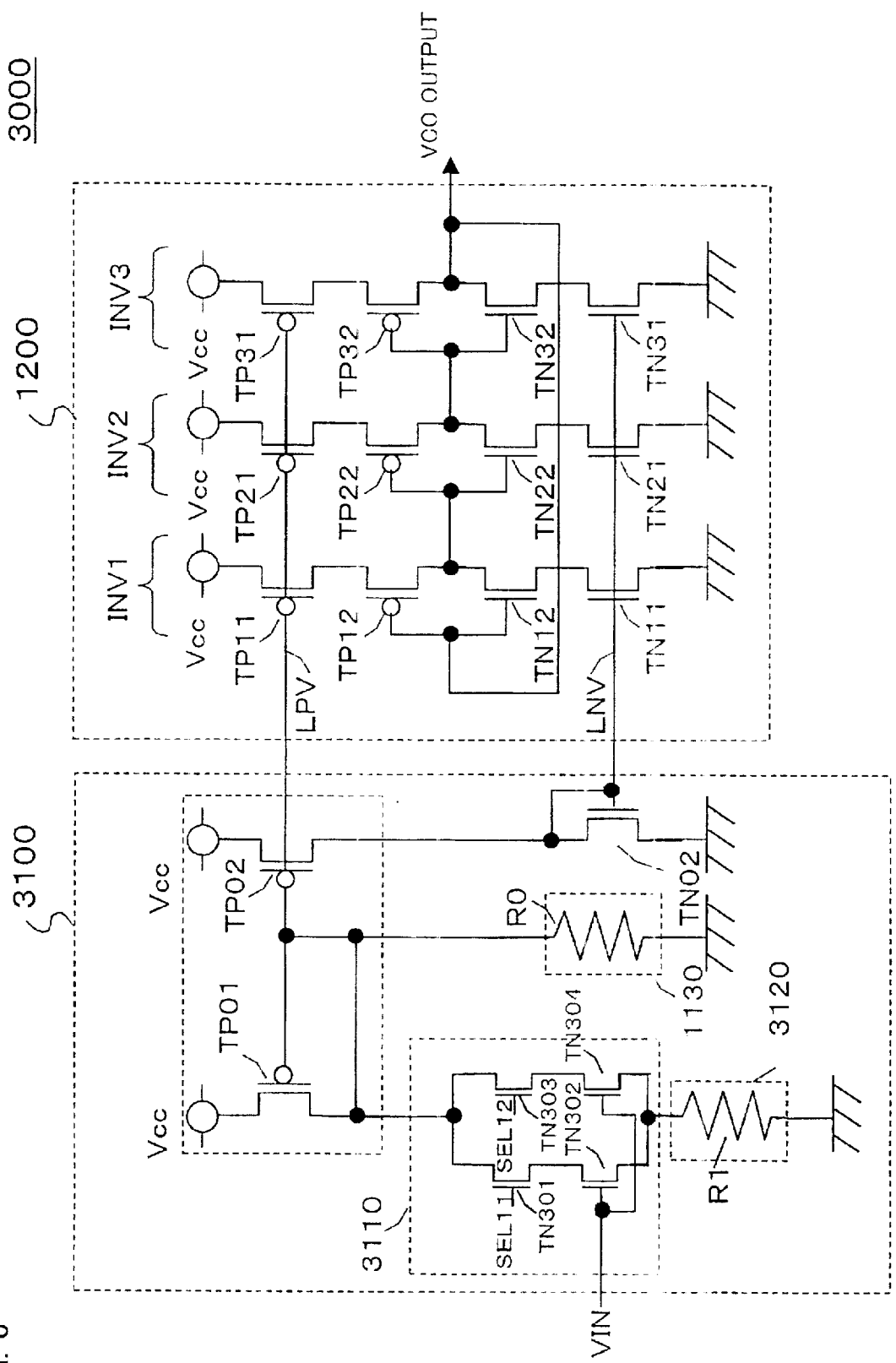
FIG. 6 is a circuit diagram for describing a configuration of a VCO circuit 3000 in a third embodiment according to the present invention.

FIG. 6 is a circuit diagram for describing a configuration of a VCO circuit 3000 in a third embodiment according to the present invention.

VCO circuit 3000 as in the case of VCO circuit 2000 can be used in place of a VCO circuit 1000.

The configuration of VCO circuit 3000 differs from that of VCO circuit 1000 described with reference to FIGS. 2 and 3 in the following respects.

First, a control voltage input section 3110 is provided in place of a control voltage input section 1110.

On the other hand, a first current mirror resistance section 3120 provided in place of a first current mirror resistance section 1120 includes a resistor R1 provided between control voltage input section 3110 and a ground potential GND.

Referring to FIG. 6, control voltage input section 3110 includes N-channel MOS transistors TN301 and TN302 which are connected in series between a drain of a transistor TP01 and resistor R1. Control voltage input section 3110 also includes N-channel MOS transistors TN303 and TN304 which are connected in series between the drain of transistor TP01 and resistor R1. Transistor TN301 receives a control signal SEL11 and a gate of transistor TN303 receives a control signal SEL12. Gates of transistors TN303 and TN304 receive a control voltage VIN, respectively.

It is assumed herein that transistor TN304 has a larger transistor size corresponding to a current value which can be driven (current driving capability) than transistor TN302.

Therefore, if control signal SEL11 is in the active state and control signal SEL12 is in the inactive state, a current flows from transistor TP01 to resistor R1 in accordance with control voltage VIN inputted into transistor TN302. In this case, the current driving capability of transistor TN302 is low and the current value of the current flowing in transistor TP01 is, therefore, relatively low. Due to this, a VCO characteristic of VCO circuit 3000 is expressed by a curve CB shown in FIG. 4.

On the other hand, if control signal SEL12 is in the active state, control signal SEL11 is in the inactive state and the current value of a current flowing in transistor TP01 is controlled in accordance with the level of control voltage VIN applied to transistor TN304, a relatively high current flows in transistor TP01. Due to this, the VCO characteristic of VCO circuit 3000 is expressed by a curve CA shown in FIG. 4.

Accordingly, even with the configuration of VCO circuit 3000 shown in FIG. 6, it is possible to exhibit the same effect as that of the first embodiment.

Fourth Embodiment

Figure 7:
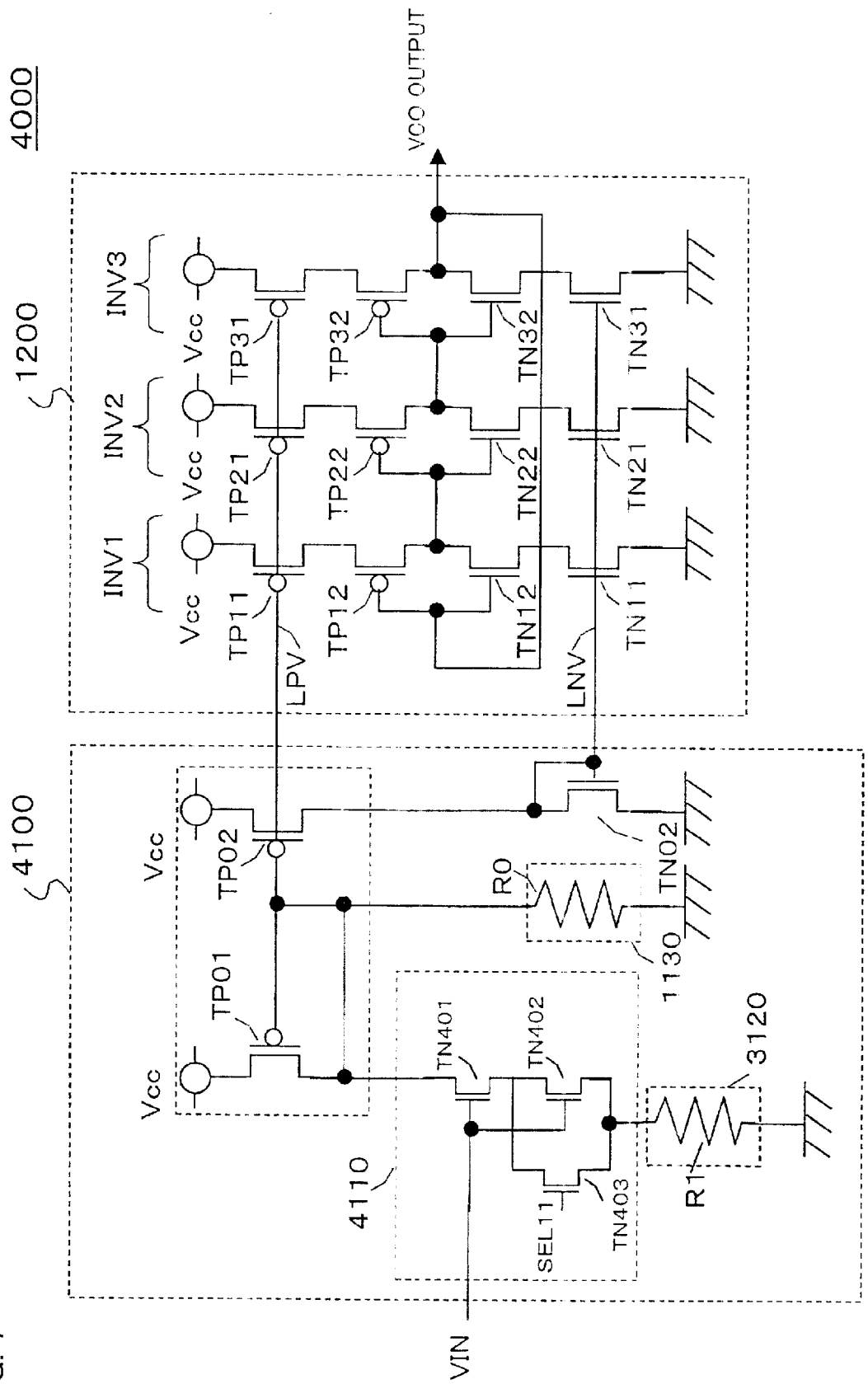
FIG. 7 is a circuit diagram for describing a configuration of a VCO circuit 4000 in a fourth embodiment according to the present invention.

FIG. 7 is a circuit diagram for describing a configuration of a VCO circuit 4000 in a fourth embodiment according to the present invention.

VCO circuit 4000 shown in FIG. 7 can be also used in place of a VCO circuit 1000 in the first embodiment described with reference to FIGS. 2 and 3.

The configuration of VCO circuit 4000 shown in FIG. 7 differs from that of a VCO circuit 3000 in the third embodiment shown in FIG. 6 in that a control voltage input section 4110 is provided in place of a control voltage input section 3110.

Since the remaining constituent elements of VCO circuit 4000 are the same as those of VCO circuit 3000, the same elements are denoted by the same reference symbols shown in FIG. 6 and will not be repeatedly described herein.

Referring to FIG. 7, control voltage input section 4110 includes N-channel MOS transistors TN401 and TN402 which are provided in series between a drain of a transistor TP01 and a resistor R1. Gates of transistors TN401 and TN402 receive a control voltage VIN, respectively.

Control voltage input section 4110 also includes an N-channel MOS transistor TN403 which is provided between a connection node connecting transistors TN401 and TN402 and resistor R1. A gate of transistor TN403 receives a control signal SEL11.

Therefore, if control signal SEL11 is in an inactive state, transistor TN403 turns into a shut-off state and the drain of transistor TP01 is coupled to resistor R1 through transistors TN401 and TN402.

As a result, a current value of a current flowing in transistor TP01 becomes relatively low and a VCO characteristic of VCO circuit 4000 is expressed by a curve CB shown in FIG. 4.

On the other hand, if control signal SEL11 is in an active state and transistor TN403 is fixed to a conductive state, the current value of the current flowing in transistor TP01 is controlled according to change of a channel conductance of transistor TN401 which receives control voltage VIN. Due to this, the current value of the current flowing in transistor TP01 becomes relatively high and the VCO characteristic of VCO circuit 4000 is expressed by a curve CA shown in FIG. 4.

Accordingly, by controlling the level of control signal SEL11, VCO circuit 4000 exhibits the same effect as that of VCO circuit 1000 in the first embodiment.

Fifth Embodiment

Figure 8:
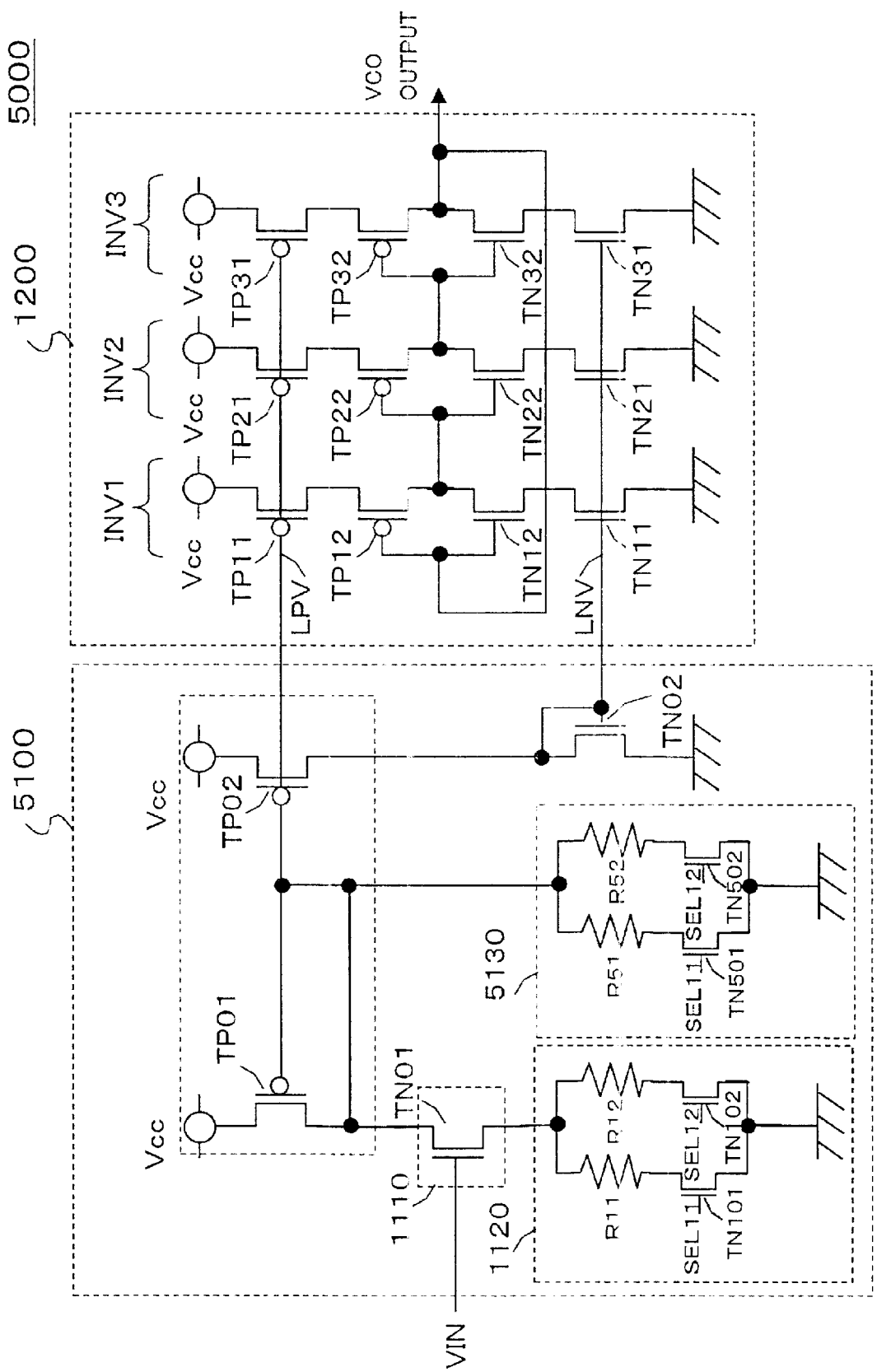
FIG. 8 is a circuit diagram for describing a configuration of a VCO circuit 5000 in a fifth embodiment according to the present invention.

FIG. 8 is a circuit diagram for describing a configuration of a VCO circuit 5000 in a fifth embodiment according to the present invention.

The configuration of VCO circuit 5000 shown in FIG. 8 differs from that of a VCO circuit 1000 in the first embodiment shown in FIG. 3 in that a second current mirror resistance section 5130 is provided in place of a second current mirror resistance section 1130.

Since the remaining constituent elements of VCO circuit 5000 are the same as those of VCO circuit 1000 shown in FIG. 3, the same elements are denoted by the same reference symbols shown in FIG. 3 and will not be repeatedly described herein.

Referring to FIG. 8, second current mirror resistance section 5130 includes a resistor R51 and an N-channel MOS transistor TN501 which are connected in series between a gate of a transistor TP01 and a ground potential GND. A gate of transistor TN501 receives a control signal SEL11.

Second current mirror resistance section 5130 also includes a resistor R52 and an N-channel MOS transistor TN502 which are connected in series between the gate of transistor TP01 and ground potential GND. A gate of transistor TN502 receives control signal SEL12.

It is assumed herein that a resistance value of a resistor R11 in a first current mirror resistance section 1120 is lower than that of a resistor R12 and that the resistance value of resistor R51 in second current mirror resistance section 5130 is lower than that of resistor R52.

Figure 9:
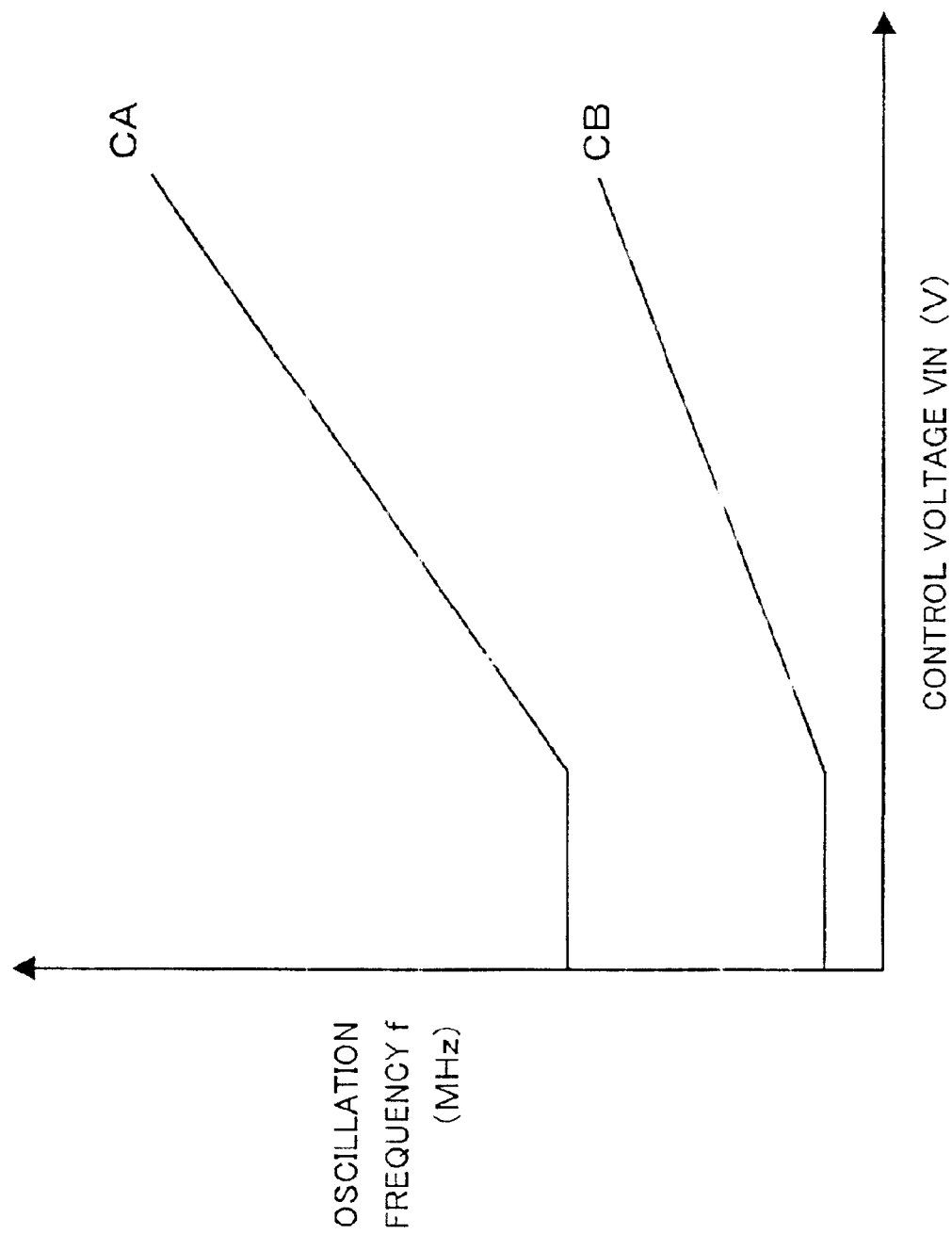
FIG. 9 is a graph for describing the VCO characteristic of VCO circuit 5000 shown in FIG. 8.

FIG. 9 is a graph for describing a VCO characteristic of VCO circuit 5000 shown in FIG. 8.

If control signal SEL11 is in an active state and control signal SEL12 is in an inactive state, for example, a source of a transistor TN01 is connected to ground potential GND through resistor R11 which has a lower resistance value. The gate of transistor TP01 is also coupled to ground potential GND through resistor R51 which has a lower resistance value.

Due to this, an oscillation frequency of VCO circuit 5000 has a relatively high value in a region in which control voltage VIN is high, i.e., a channel conductance of transistor TN01 is high. On the other hand, in a region in which control voltage VIN is low, i.e., the channel conductance of transistor TN01 is low, contribution of first current mirror resistance section 1120 to the current value of the current flowing in the current mirror circuit consisting of transistors TP01 and TP02 becomes relatively smaller than that of second current mirror resistance section 5130 thereto. As a result, in the region in which control voltage VIN is low, the current value of the current flowing in the current mirror circuit is specified by the resistance value of resistor R51. Due to this, in this region, the oscillation frequency of VCO circuit 5000 has a higher value than that in a case where resistor R52 is selected. As a result, the VCO characteristic of VCO circuit 5000 is expressed by a curve CA shown in FIG. 9.

On the other hand, if control signal SEL11 is in the inactive state and control signal SEL12 is in the active state, the source of transistor TN01 is coupled to ground potential GND through resistor R12 having a higher resistance value and the gate of transistor TP01 is also coupled to ground potential GND through resistor R52 having a higher resistance value.

Accordingly, the current value of the current flowing in transistor TP01 constituting the current mirror circuit becomes relatively low. As a result, the VCO characteristic of VCO circuit 5000 is expressed by a curve CB shown in FIG. 9.

Compared with the VCO characteristic shown in FIG. 4, VCO circuit 5000 can operate in the same frequency region as that in FIG. 4 by decreasing the inclinations of both curves CA and CB. Due to this, VCO circuit 5000 having such a characteristic as shown in FIG. 9 has a greater improvement in jitter characteristic. In other words, a frequency control range of VCO circuit 5000 can be switched and VCO circuit 5000 has an oscillation characteristic having good jitter characteristic.

Modification of Fifth Embodiment

In a configuration of VCO circuit 5000 in the fifth embodiment shown in FIG. 8, configurations of a first current mirror resistance section 1120 and a second current mirror resistance section 5130 can be changed to the other configurations, respectively.

Figure 10:
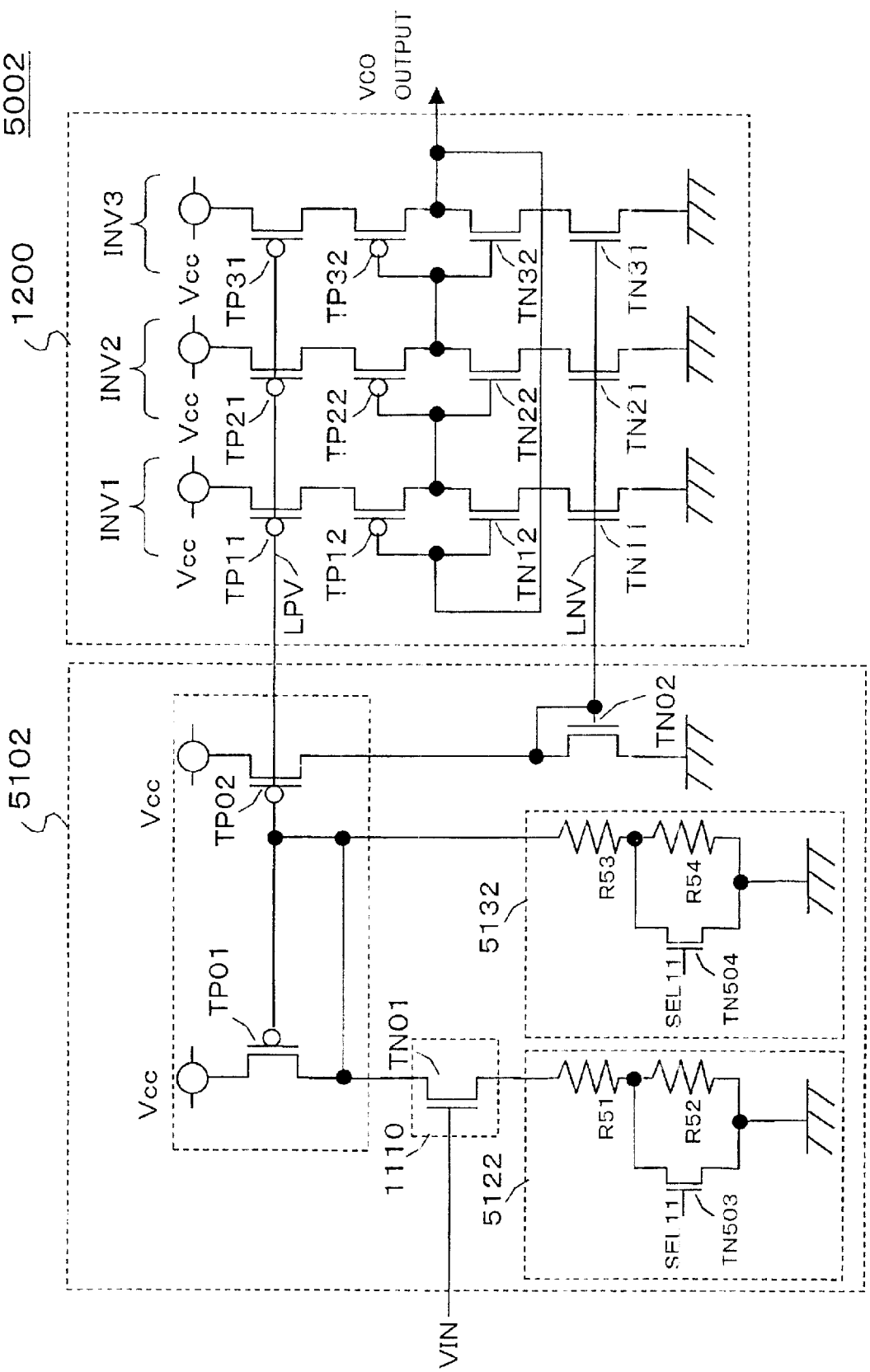
FIG. 10 is a circuit diagram showing a configuration of a VCO circuit 5002 in a modification of the fifth embodiment.

FIG. 10 is a circuit diagram which shows a configuration of a VCO circuit 5002 in a modification of the fifth embodiment in which the configurations of first and second current mirror resistance sections 1120 and 5130 are changed.

Referring to FIG. 10, a first current mirror resistance section 5122 provided in place of first current mirror resistance section 1120 is provided with resistors R51 and R52 which are connected in series between a source of a transistor TN01 and a ground potential GND, and an N-channel MOS transistor TN503 which is turned into a conductive state by a control signal SEL11 and which is provided in parallel to resistor R52.

Likewise, a second current mirror resistance section 5132 provided in place of second current mirror resistance section 5130 is provided with resistors R53 and R54 which are connected in series between a gate of a transistor TP01 and ground potential GND, and an N-channel MOS transistor TN504 which is turned into a conductive state by control signal SEL11 and which is provided in parallel to resistor R54.

By using variable resistors shown in FIG. 10 as first and second current mirror resistance sections 5122 and 5132, respectively, VCO circuit 5002 exhibits the same effect as that of VCO circuit 5000 in the fifth embodiment shown in FIG. 8.

In FIG. 10, both of first and second current mirror resistance sections 1120 and 5130 are replaced by first and second current mirror resistance sections 5122 and 5132, respectively. Alternatively, one of first and second current mirror resistance sections 1120 and 5130 may be replaced by first current mirror resistance section 5122 or second current mirror resistance section 5132.

Sixth Embodiment

Figure 11:
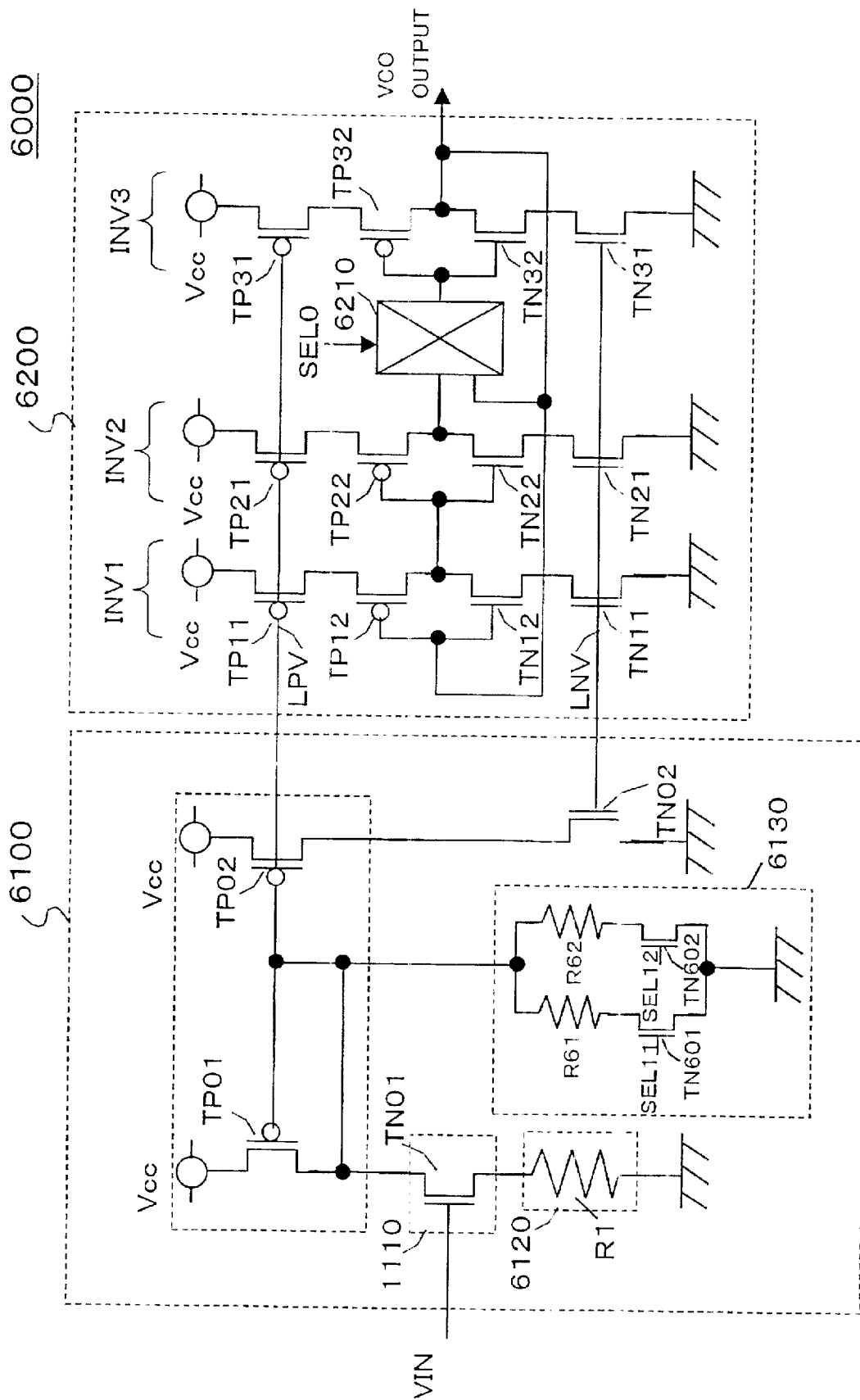
FIG. 11 is a circuit diagram for describing a configuration of a VCO circuit 6000 in a sixth embodiment according to the present invention.

FIG. 11 is a circuit diagram for describing a configuration of a VCO circuit 6000 in a sixth embodiment according to the present invention.

The configuration of VCO circuit 6000 in the sixth embodiment differs from that of a VCO circuit 1000 in the first embodiment shown in FIG. 3 in the following respects.

First, a first current mirror resistance section 6120 is provided in place of a first current mirror resistance section 1120. First current mirror resistance section 6120 includes a resistor R1 which is connected between a source of a transistor TN01 and a ground potential GND.

Further, a second current mirror resistance section 6130 is provided in VCO circuit 6000 in place of a second current mirror resistance section 1130. Second current mirror resistance section 6130 includes a resistor R61 and an N-channel MOS transistor TN601 which are connected in series between a gate of a transistor TP01 and ground potential GND. A gate of transistor TN601 receives control signal SEL11. Second current mirror resistance section 6130 also includes a resistor R62 and an N-channel MOS transistor TN602 which are connected in series between the gate of transistor TP01 and ground potential GND. A gate of transistor TN602 receives control signal SEL12.

Further, in VCO circuit 6000, a ring oscillator circuit 6200 is provided in place of ring oscillator circuit 1200. The difference of a configuration of ring oscillator circuit 6200 from that of ring oscillator circuit 1200 is that a select circuit 6210 is provided between an output of an inverter INV2 and an input of an inverter INV3.

Select circuit 6210 receives the outputs of inverters INV2 and INV3 and selectively applies one of the outputs of inverters INV2 and INV3 to the input of inverter INV3 in accordance with a control signal SEL0.

More generally, in ring oscillator 6200 consisting of odd stages of inverters cascaded to one another, select circuit 6210 is provided between an output node of the first half of the even stage of inverter and an input of the second half of a predetermined number of odd stages of inverters. This select circuit 6210 selectively applies an output of an inverter chain of the first half of the predetermined number of even stages of inverters and an output of an inverter chain of the second half of the predetermined number of odd stages of inverters, to the input of the inverter chain of the second half of the odd stages of inverters, thereby making it possible to change the number of stages of inverter chains in accordance with control signal SEL0. Alternatively, in ring oscillator circuit 6200 consisting of odd stages of inverters cascaded to one another, select circuit 6210 may be provided so as to receive the output of the inverter in the final stage and the outputs of the first half of the predetermined number of odd stages of inverters and selectively applies one of the outputs to the input of the inverter in the first stage, thereby changing the number of stages of inverters according to select signal SEL0.

It is assumed herein that control signal SEL0 is applied from an internal circuit 4 to an internal clock generation circuit 100 based on, for example, an instruction from an outside of a semiconductor integrated circuit device 1 as in the case of control signals SEL11 and SEL12.

Even with the above-mentioned configuration, a resistance value between the gate of transistor TP01 and ground potential GND can be made variable according to levels of control signals SEL11 and SEL12.

It is assumed herein that the resistance value of resistor R61 is lower than that of resistor R62. In this case, if control signal SEL11 is in an active state and control signal SEL12 is in an inactive state, a current value of a current flowing in a current mirror circuit including transistor TP01 becomes relatively high in a region in which a control voltage VIN is low. Conversely, if control signal SEL12 is in the active state and control signal SEL11 is in the inactive state, the current value of the current flowing in the current mirror circuit becomes relatively low in the region in which control voltage VIN is low.

Further, if the number of stages of ring oscillator circuit 6200 is decreased, the frequency region which is changed in accordance with control voltage VIN is moved to a higher frequency region.

Accordingly, it is assumed, for example, that control signal SEL11 is in the active state, control signal SEL12 is in the inactive state and resistor R61 is selected. It is also assumed that fewer stages of inverters of ring oscillator circuit 6200 are used by select circuit 6210 for oscillation. If so, a VCO characteristic of VCO circuit 6000 is expressed by a curve CA shown in FIG. 9.

On the other hand, it is assumed that control signal SEL11 is in the inactive state, control signal SEL12 is in the active state and resistor R62 is selected. In this case, if more stages of inverters are set to be used by select circuit 6210 for oscillation, the VCO characteristic of VCO circuit 6000 is expressed by a curve CB shown in FIG. 9.

In this case, compared with the VCO characteristic shown in FIG. 4, even if inclinations of both of curves CA and CB are decreased, it is possible to operate VCO circuit 6000 in the same frequency region as that in case of FIG. 4. Due to this, VCO circuit 6000 exhibiting such a characteristic as shown in FIG. 9 has a greater improvement in jitter characteristic.

That is, the frequency control range of VCO circuit 6000 can be switched and VCO circuit 6000 has an oscillation characteristic having good jitter characteristic.

Modification of Sixth Embodiment

Figure 12:
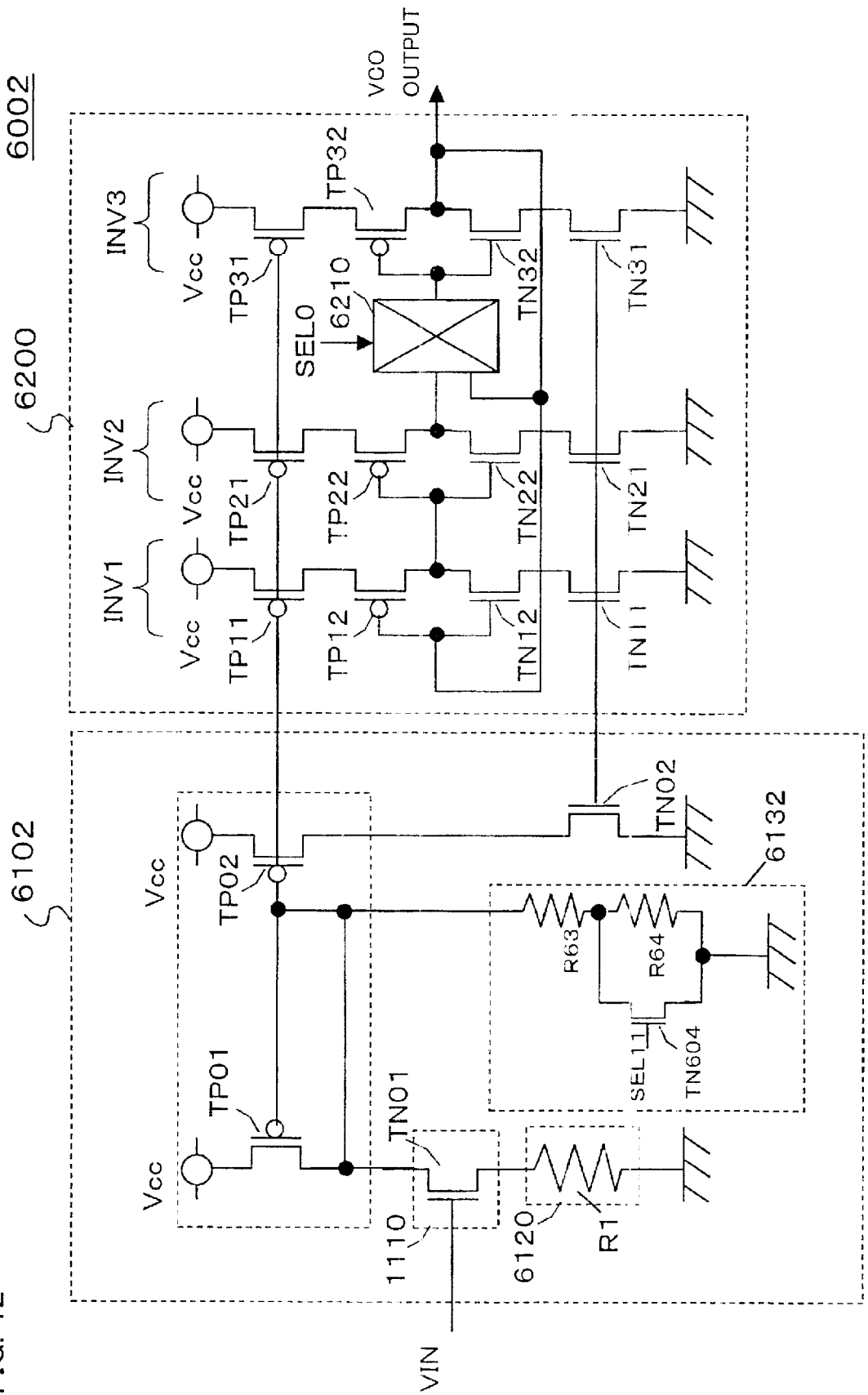
FIG. 12 is a circuit diagram for describing a configuration of a VCO circuit 6002 in a modification of the sixth embodiment.

FIG. 12 is a circuit diagram for describing a configuration of a VCO circuit 6002 in a modification of the sixth embodiment according to the present invention.

VCO circuit 6002 is provided with a circuit 6132 which is same as a second current mirror resistance section 5132 in VCO circuit 5002 shown in FIG. 9 in place of a second current mirror resistance section 6130 in VCO circuit 6000 shown in FIG. 10.

Even with this modified configuration, VCO circuit 6002 can exhibit the same effect as that of VCO circuit 6000.

(Seventh Embodiment)

Figure 13:
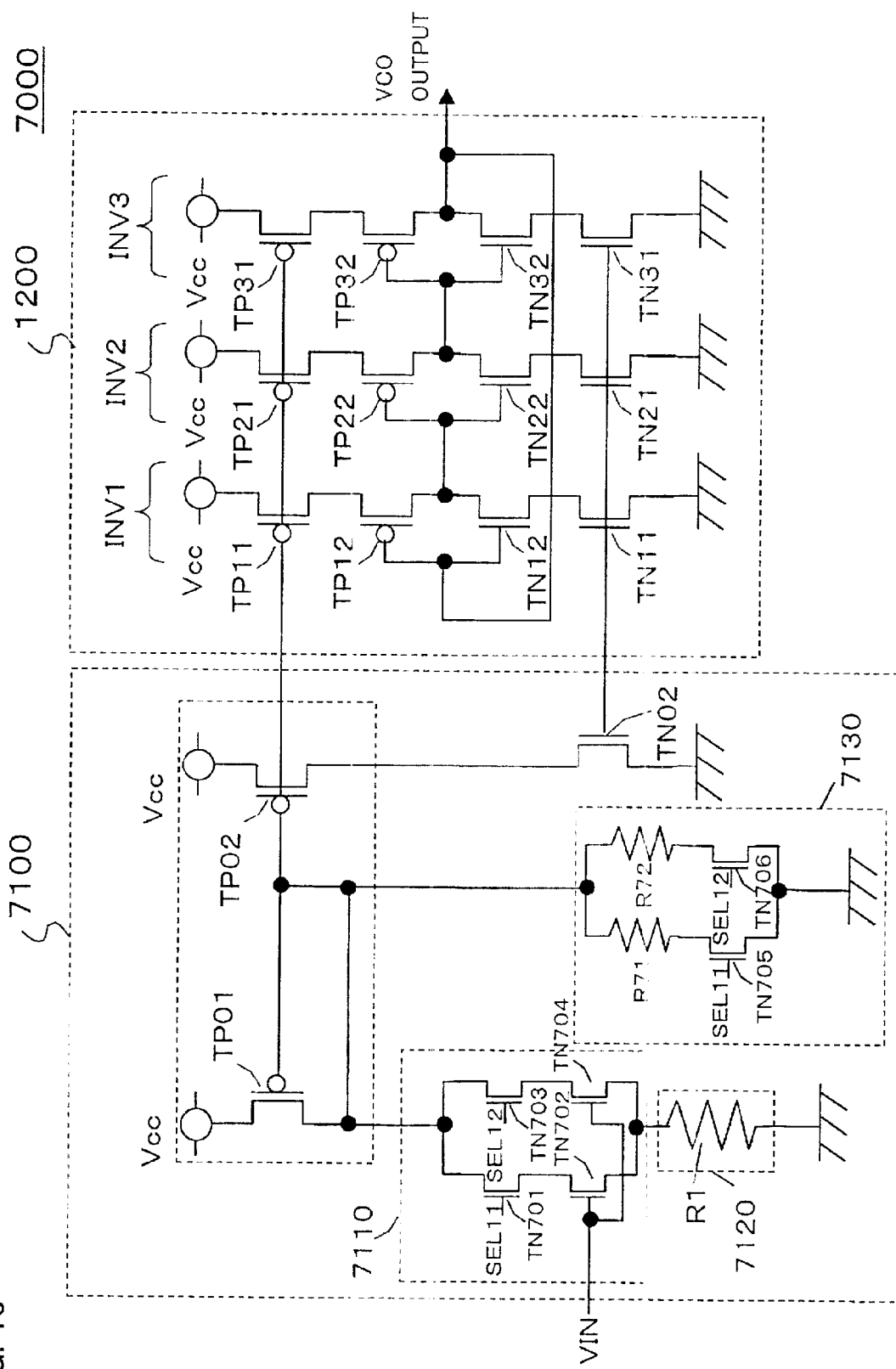
FIG. 13 is a circuit diagram for describing a configuration of a VCO circuit 7000 in a seventh embodiment according to the present invention.

FIG. 13 is a circuit diagram for describing a configuration of a VCO circuit 7000 in a seventh embodiment according to the present invention.

The configuration of VCO circuit 7000 differs from that of a VCO circuit 1000 described above with reference to FIGS. 2 and 3 in the following respects. First, a control voltage input section 7110 is provided in place of control voltage input section 1110. In addition, a first current mirror resistance section 1120 includes a resistor R1 which is connected between control voltage input section 7110 and a ground potential GND.

Further, a second current mirror resistance section 7130 provided in place of a second current mirror resistance section 1130 is constituted so as to have a resistance value variable in accordance with control signals SEL11 and SEL12.

That is, control voltage input section 7110 includes N-channel MOS transistors TN701 and TN702 which are connected in series between a drain of a transistor TP01 and resistor R1. Control voltage input section 7110 also includes N-channel MOS transistors TN703 and TN704 which are connected in series between the drain of transistor TP01 and resistor R1. Transistor TN701 receives control signal SEL11 and a gate of transistor TN703 receives control signal SEL12. Gates of transistors TN702 and TN704 receive a control voltage VIN, respectively.

It is assumed herein that transistor TN702 has a larger transistor size than transistor TN704.

In addition, second current mirror resistance section 7130 includes a resistor R71 and an N-channel MOS transistor TN705 which are connected in series between a gate of transistor TP01 and ground potential GND. Second current mirror resistance section 7130 also includes a resistor R72 and an N-channel MOS transistor TN706 which are connected in series between the gate of transistor TP01 and ground potential GND.

A gate of transistor TN705 receives control signal SEL11 and a gate of transistor TN706 receives control signal SEL12.

It is assumed herein that a resistance value of resistor R71 is lower than that of resistor R72.

Accordingly, if control signal SEL11 is in an active state, control signal SEL12 is in an inactive state and transistor TN701 and resistor R71 are selected, a VCO characteristic of VCO circuit 7000 is expressed by a curve CA shown in FIG. 9.

On the other hand, if control signal SEL11 is in the inactive state, control signal SEL12 is in the active state and transistor TN702 and resistor R72 are selected, the VCO characteristic of VCO circuit 7000 is expressed by a curve CB shown in FIG. 9.

In this case, compared with the VCO characteristics shown in FIG. 4, even if inclinations of both of curves CA and CB are decreased, it is possible to operate VCO circuit 7000 in the same frequency range as that in case of FIG. 4. Due to this, VCO circuit 7000 has a greater improvement in jitter characteristic. That is, the frequency control range of VCO circuit 7000 can be switched and VCO circuit 7000 has an oscillation characteristic having good jitter characteristic.

Modification of Seventh Embodiment

In a configuration of a VCO circuit 7000 in the seventh embodiment shown in FIG. 13, configurations of a control voltage input section 7110 and a second current mirror resistance section 7130 can be replaced by the other configurations, respectively.

Figure 14:
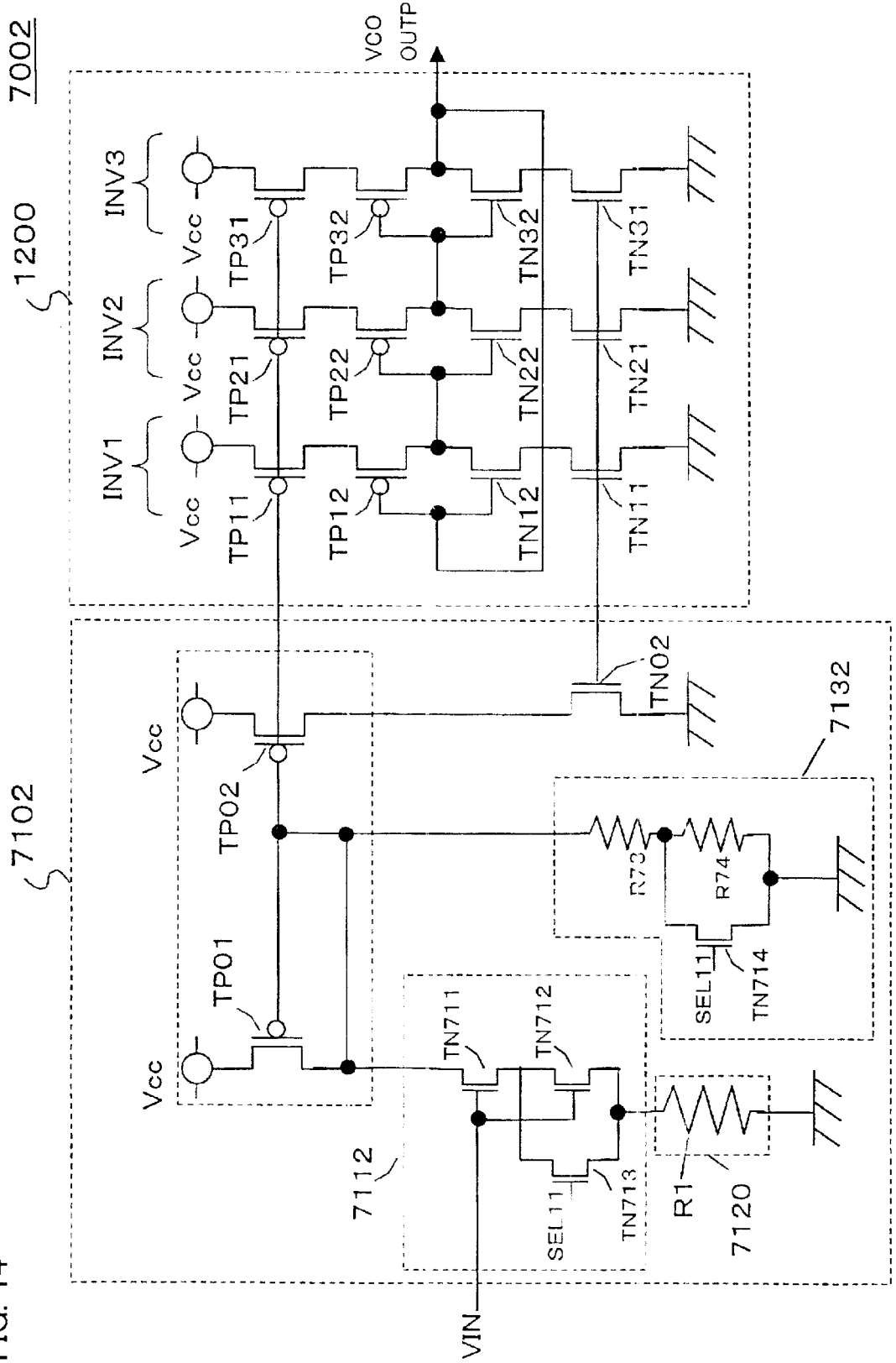
FIG. 14 is a circuit diagram showing a configuration of a VCO circuit 7002 in a modification of the seventh embodiment.

FIG. 14 is a circuit diagram showing a configuration of a VCO circuit 7002 in a modification of the seventh embodiment in which the configurations of control voltage input section 7110 and second current mirror resistance section 7130 are changed.

Referring to FIG. 14, a control voltage input section 7112 provided in place of control voltage input section 7110 is provided with N-channel MOS transistors TN711 and TN712 which are connected in series between a drain of a transistor TP01 and a resistor R1, and an N-channel MOS transistor TN713 which is turned into a conductive state by a control signal SEL11 and which is provided in parallel to transistor TN712.

A second current mirror resistance section 7132 provided in place of second current mirror resistance section 7130 is provided with resistors R73 and R74 which are connected in series between a gate of a transistor TP02 and a ground potential GND, and an N-channel MOS transistor TN714 which is turned into the conductive state by control signal SEL11 and which is provided in parallel to resistor R74.

Even with the configuration shown in FIG. 4, VCO circuit 7002 exhibits the same effect as that of VCO circuit 7000 in the seventh embodiment shown in FIG. 13.

In FIG. 14, control voltage input section 7110 and second current mirror resistance section 7130 shown in FIG. 13 are replaced by control voltage input section 7112 and second current mirror resistance section 7132, respectively. Alternatively, one of control voltage input section 7110 and second current mirror resistance section 7130 may be replaced by control voltage input section 7112 or second current mirror resistance section 7132.

Eighth Embodiment

Levels of control signals SEL11, SEL12 and SEL0 for controlling first and second current mirror resistance sections and a control voltage input section can be set by a register provided on a chip on which a VCO circuit is mounted.

Figure 15:
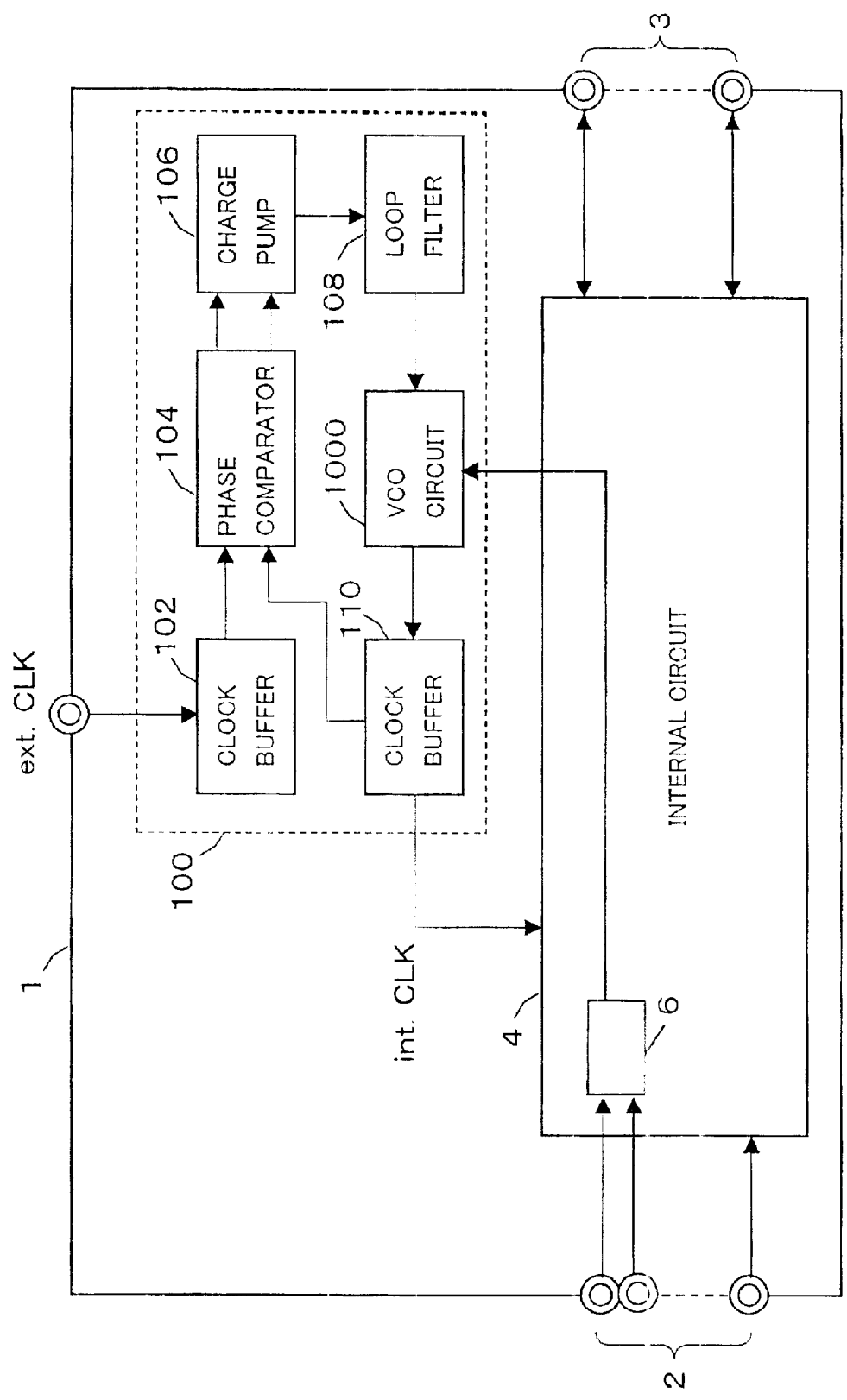
FIG. 15 is a schematic block diagram for describing the configuration of semiconductor integrated circuit device 1.

FIG. 15 is a schematic block diagram for describing such a semiconductor integrated circuit device 1.

Data stored in a register 6 is rewritten in accordance with an external control signal from control input terminals 2. In accordance with the data in register 6, control signals SEL11, SEL12 and the like are applied from an internal circuit 4 to an internal clock generation circuit 100.

Alternatively, settings of these control signals may be directly inputted from an external terminal. In that case, a buffer circuit is provided in place of register 6. External control signals from control input terminals 2 are applied, as control signals SEL11, SEL12 and the like, from internal circuit 4 to internal clock generation circuit 100.

Figure 22:
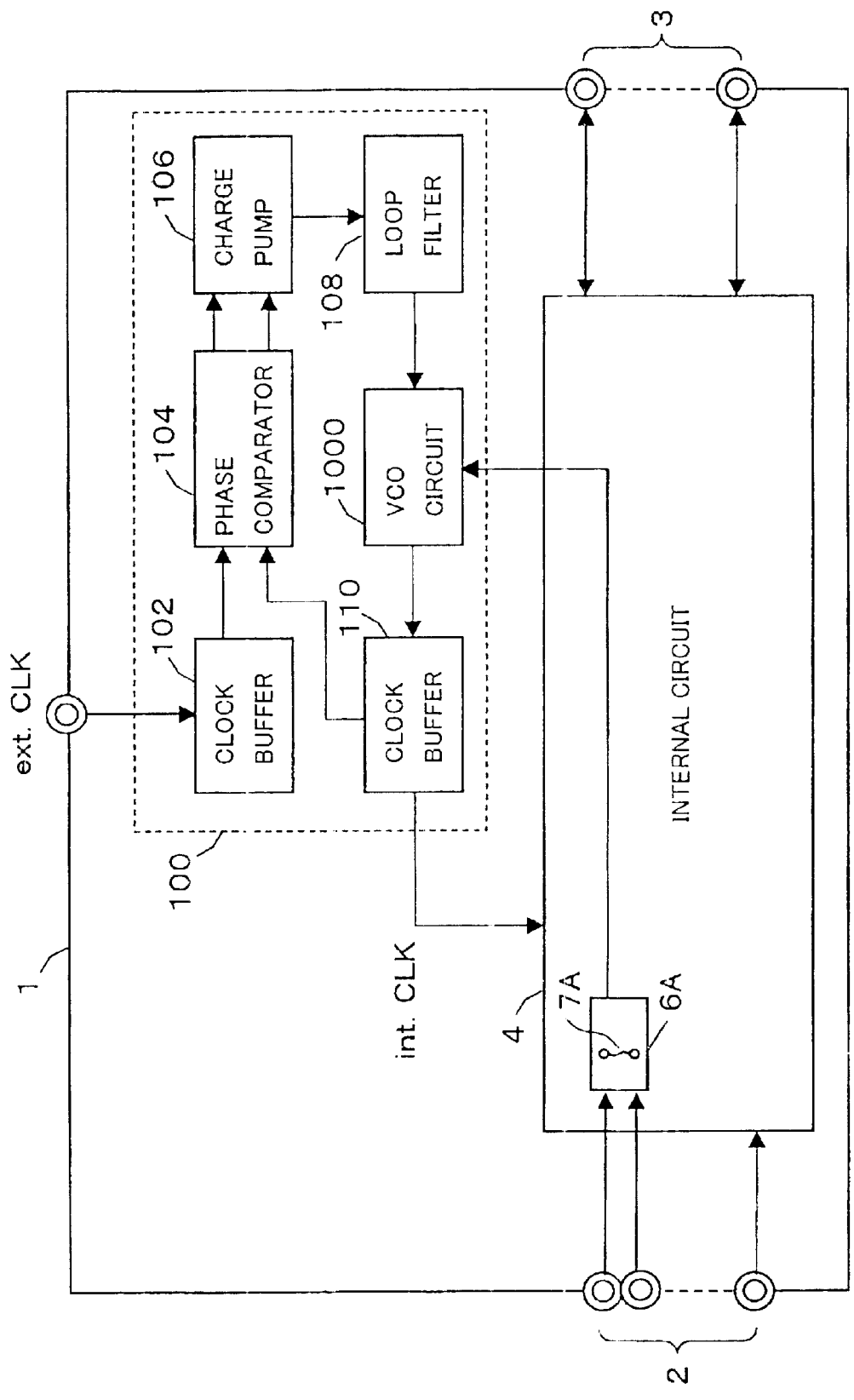
FIG. 22 is a circuit diagram for a configuration having a non-volatile storage element.

It is also possible that values of these control signals are stored in a nonvolatile storage element, e.g., a fuse element, and that the values are set by laser trimming. In that case as shown in FIG. 22, a programming circuit 6A using a fuse element 7A is provided in place of register 6. Control signals SEL11, SEL12 and the like, in which levels of which are set according to whether or not the fuse element of this programming circuit is blown, are applied from internal circuit 4 internal clock generation circuit 100.

In the above embodiments, the configuration in which each of the resistance values of the first and second current mirror resistance sections and the conductance of the control voltage input sections is made variable to two stages by two control signals SEL11 and SEL12 has been described. However, the present invention is not limited to this configuration. It is also possible to change the resistance values and the like to stages other than two stages using more control signals.

Configuration examples in which the resistance values and the like are changed to stages other than two stages will be briefly described.

Figure 16:
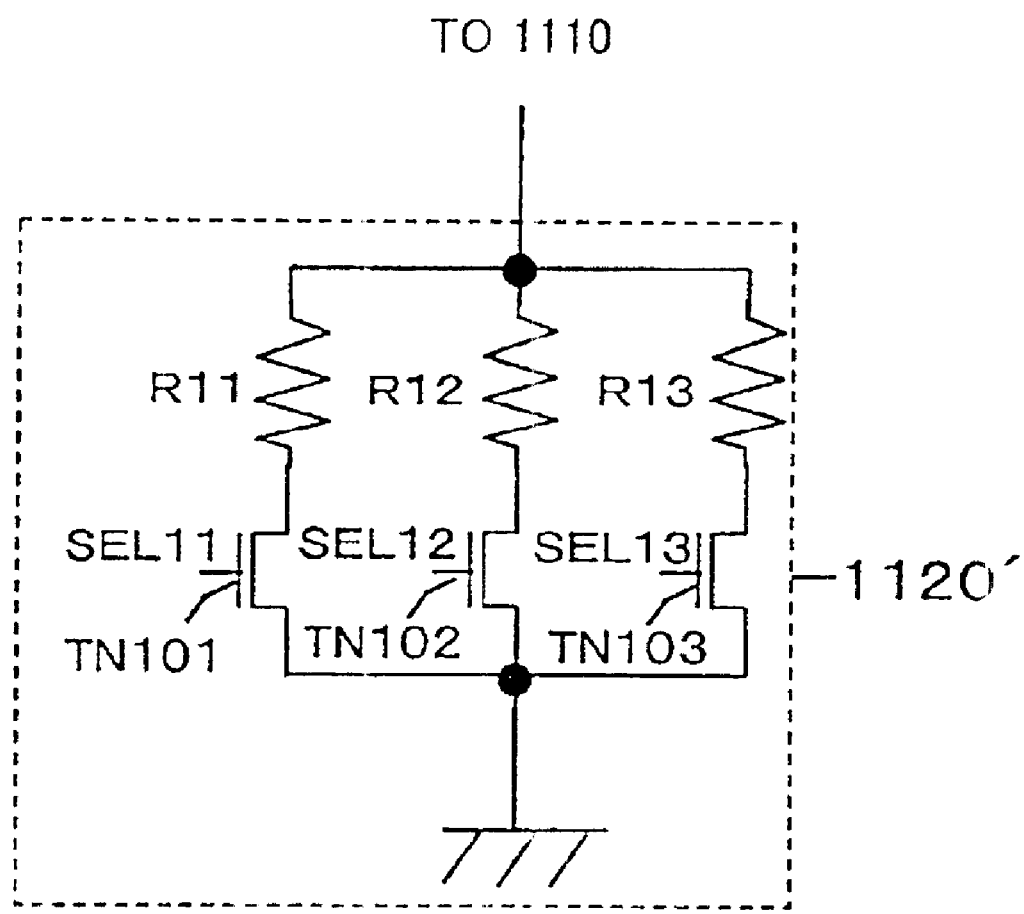
FIG. 16 is a block diagram showing a configuration that a first current mirror resistance section 1120 shown in FIG. 3 is made variable to three stages by control signals SEL11 to SEL13.

FIG. 16 shows a configuration in which a resistance value of a first current mirror resistance section 1120 shown in FIG. 3 is made variable to three stages by control signals SEL11 to SEL13.

Figure 17:
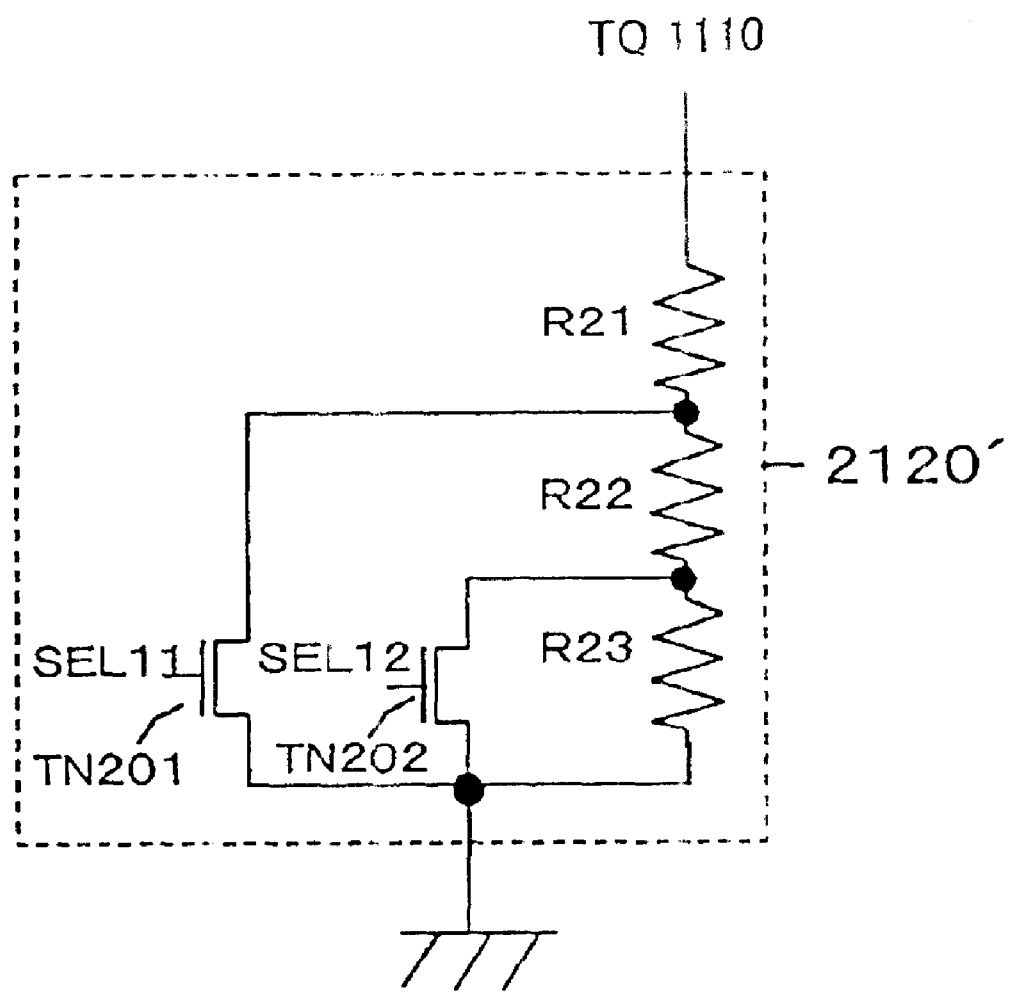
FIG. 17 is a block diagram showing a configuration that a first current mirror resistance section 2120 shown in FIG. 5 is made variable to three stages by control signals SEL11 to SEL12.

FIG. 17 shows a configuration in which a resistance value of first current mirror resistance section 2120 shown in FIG. 5 is made variable to three stages by control signals SEL11 to SEL12.

Figure 18:
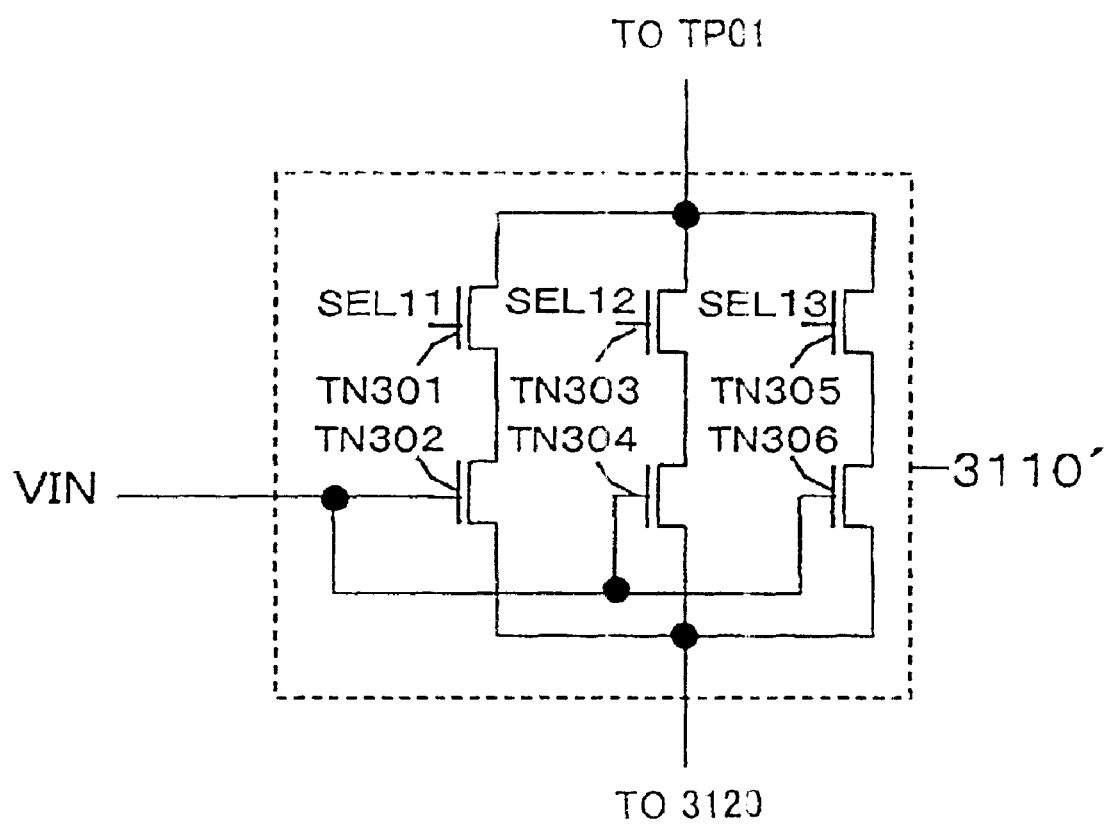
FIG. 18 is a block diagram showing a configuration that a control voltage input section 3110 shown in FIG. 6 is made variable to three stages by control signals SEL11 to SEL13.

FIG. 18 shows a configuration in which a conductance of a control voltage input section 3110 shown in FIG. 6 is made variable to three stages by control signals SEL11 to SEL13.

Figure 19:
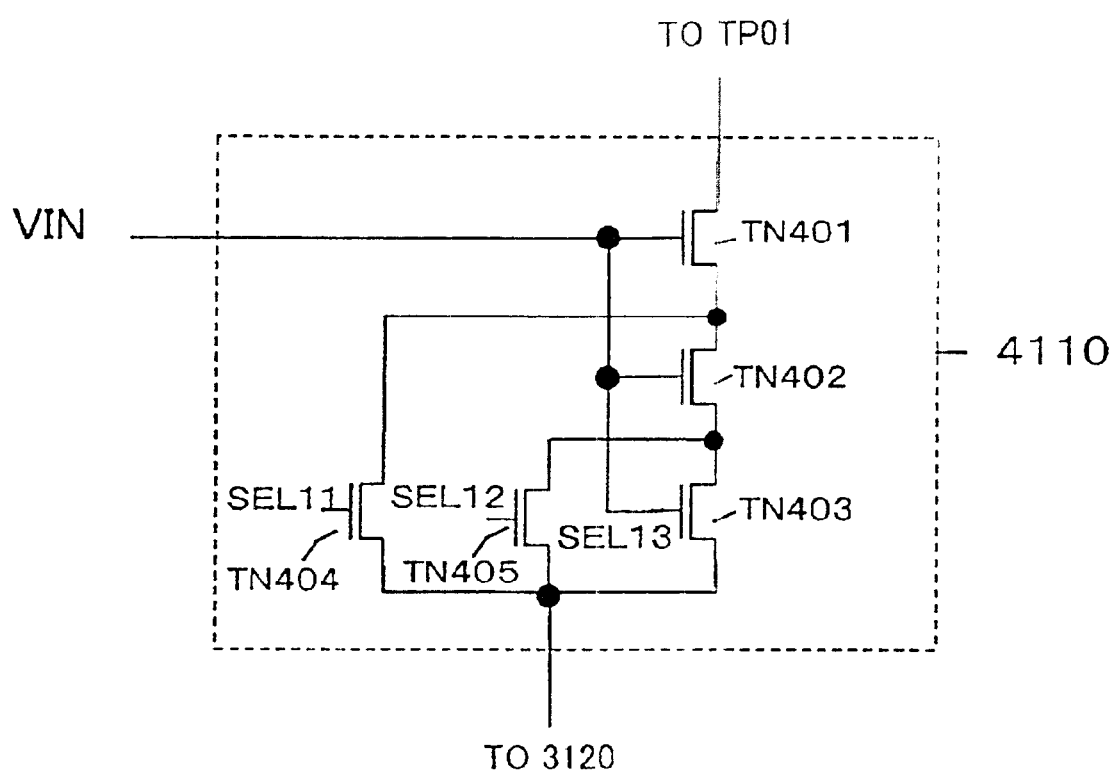
FIG. 19 is a block diagram showing a configuration that a control voltage input section 4110 shown in FIG. 7 is made variable to three stages by control signals SEL11 to SEL12.

FIG. 19 shows a configuration in which a conductance of control voltage input section 4110 shown in FIG. 7 is made variable to three stages by control signals SEL11 to SEL12.

If the resistance values and the like are made variable to more stages than two, the number of stages may be increased as in the same manner as described above.

Furthermore, one of the configurations corresponding to FIGS. 16 to 19 or a configuration in which the resistance values and the like are made variable to more stages than two can be employed in the other embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage controlled oscillation circuit comprising:
   a self-excited oscillation circuit oscillating with a frequency in accordance with a level of an operating current control signal, wherein said self-excited oscillation circuit includes
      a plurality of stages of inversion circuits connected in series to each other, and each having a field effect transistor as a switching element to operate with a current in accordance with said operating current control signal; and
   an operating current control circuit generating said operating current control signal in accordance with a control voltage applied from an outside of said voltage controlled oscillation circuit, wherein said operating current control circuit includes:
      a current mirror circuit generating a constant current flowing from a first power supply node to a second power supply node, and outputting said operating current control signal in accordance with a value of said constant current; and
      a current mirror control circuit controlling the value of said constant current generated by said current mirror circuit in accordance with said control voltage, and changing a range, in which the value of said constant current is changed in response to a change of said control voltage, in accordance with an instruction signal applied from the outside of said voltage controlled oscillation circuit; and a fuse program circuit setting a level of said instruction signal.

2. The voltage controlled oscillation circuit according to claim 1, wherein said current mirror circuit includes:
 a first field effect transistor having a source coupling to said first power supply node, and having a gate and a drain coupling to each other; and
 a second field effect transistor having a source coupling to said first power supply node, and having a gate coupling to the gate of said first field effect transistor, and said current mirror control circuit includes:
 a control voltage input circuit controlling a current value of a current directed from the drain of said first field effect transistor to said second power supply node in accordance with said control voltage;
 a first resistance circuit provided between said control voltage input circuit and said second power supply node, and having a resistance value variable in accordance with said instruction signal; and
 a second resistance circuit provided between the gaze of said first field effect transistor and said second power supply node.

3. The voltage controlled oscillation circuit according to claim 2, wherein said instruction signal has a plurality of switch control signals, and said first resistance circuit includes:
 a plurality of resistors provided on a plurality of conductive paths between said control voltage input circuit and said second power supply node, respectively; and
 a plurality of switch circuit provided on said plurality of conductive paths, respectively, and controlled by said plurality of switch control signals, respectively.

4. The voltage controlled oscillation circuit according to claim 2, wherein said instruction signal has a plurality of switch control signals, and said first resistance circuit includes:
 a plurality of resistors provided in series on a conductive path between said control voltage input circuit and said second power supply node; and
 a plurality of switch circuits provided between a plurality of connection nodes connecting said plurality of resistors to one another and said second power supply node, respectively, and controlled by said plurality of switch control signals, respectively.

5. The voltage controlled oscillation circuit according to claim 1, wherein said current mirror circuit includes:
 a first field effect transistor having a source coupling to said first power supply node, and having a gate and a drain coupling to each other; and
 a second field effect transistor having a source coupling to said first power supply node, and having a gate coupling to the gate of said first field effect transistor, and said current mirror control circuit includes:

a control voltage input circuit controlling a current value of a current directed from the drain of said first field effect transistor to said second power supply node in accordance with said control voltage;
 a first resistance circuit provided between said control voltage input circuit and said second power supply node, and having a resistance value variable in accordance with said instruction signal; and
 a second resistance circuit provided between the gate of said first field effect transistor and said second power supply node, and having a resistance value variable in accordance with said instruction signal.

6. The voltage controlled oscillation circuit according to claim 5, wherein said instruction signal has a plurality of switch control signals, and said first resistance circuit includes:
 a plurality of resistors provided on a plurality of conductive paths between said control voltage input circuit and said second power supply node, respectively; and
 a plurality of switch circuits provided on said plurality of conductive paths, respectively, and controlled by said plurality of switch control signals, respectively.

7. The voltage controlled oscillation circuit according to claim 5, wherein said instruction signal has a plurality of switch control signals, and said first resistance circuit includes:
 a plurality of resistors provided in series on a conductive path between said control voltage input circuit and said second power supply node; and
 a plurality of switch circuits provided between a plurality of connection nodes connecting said plurality of resistors to one another and said second power supply node, respectively, and controlled by said plurality of switch control signals, respectively.

8. The voltage controlled oscillation circuit according to claim 5, wherein said instruction signal has a plurality of switch control signals, and said second resistance circuit includes:
 a plurality of resistors provided on a plurality of conductive paths between the gate of said first field effect transistor and said second power supply node, respectively; and
 a plurality of switch circuits provided on said plurality of conductive paths, respectively, and controlled by said plurality of switch control signals, respectively.

9. The voltage controlled oscillation circuit according to claim 5, wherein said instruction signal has a plurality of switch control signals, and said second resistance circuit includes:
 a plurality of resistors provided in series on a conductive path between the gate of said first field effect transistor and said second power supply node; and
 a plurality of switch circuits provided between a plurality of connection nodes connecting said plurality of resistors to one another and said second power supply node, respectively, and controlled by said plurality of switch control signals, respectively.

10. The voltage controlled oscillation circuit according to claim 1, wherein
  said self-excited oscillation circuit comprises
    a stage changing circuit making the number of inversion circuits associated with an oscillation operation among said plurality of inversion circuits variable in accordance with said instruction signal,
  said current mirror circuit includes:
    a first field effect transistor having a source coupling to said first power supply node, and having a gate and a drain coupling to each other; and
    a second field effect transistor having a source coupling to said first power supply node, and having a gate coupling to the gate of said first field effect transistor, and
  said current mirror control circuit includes:
    a control voltage input circuit controlling a current value of a current directed from the drain of said first field effect transistor to said second power supply node in accordance with said control voltage;
    a first resistance circuit provided between said control voltage input circuit and said second power supply node; and
    a second resistance circuit provided between the gate of said first field effect transistor and said second power supply node, and having a resistance value variable in accordance with said instruction signal.

11. The voltage controlled oscillation circuit according to claim 10, wherein
  said instruction signal has a plurality of switch control signals, and
  said second resistance circuit includes:
    a plurality of resistors provided on a plurality of conductive paths between the gate of said first field effect transistor and said second power supply node, respectively; and
    a plurality of switch circuits provided on said plurality of conductive paths, respectively, and controlled by said plurality of switch control signals, respectively.

12. The voltage controlled oscillation circuit according to claim 10, wherein
  said instruction signal has a plurality of switch control signals, and
  said second resistance circuit includes:
    a plurality of resistors provided in series on a conductive path between the gate of said first field effect transistor and said second power supply node; and
    a plurality of switch circuits provided between a plurality of connection nodes connecting said plurality of resistors to one another and said second power supply node, respectively, and controlled by raid plurality of switch control signals, respectively.

13. A voltage controlled oscillation circuit comprising:
  a self-excited oscillation circuit oscillating with a frequency in accordance with a level of an operating current control signal, wherein said self-excited oscillation circuit includes
    a plurality of stages of inversion circuits connected in series to each other, and each having a field effect transistor as a switching element to operate with a current in accordance with said operating current control signal; and
    an operating current control circuit generating said operating current control signal in accordance with a control voltage applied from an outside of said voltage controlled oscillation circuit, wherein said operating current control circuit includes
      a current mirror circuit generating a constant current flowing from a first power supply node to a second power supply node, and outputting said operating current control signal in accordance with a value of said constant current; and
      a current mirror control circuit controlling the value of said constant current generated by said current mirror circuit in accordance with said control voltage, and changing a range, in which the value of said constant current is changed in response to a change of said control voltage, in accordance with an instruction signal applied from the outside of said voltage controlled oscillation circuit, wherein
    said current mirror circuit includes:
      a first field effect transistor having a source coupling to said first power supply node, and having a gate and a drain coupling to each other; and
      a second field effect transistor having a source coupling to said first power supply node, and having a gate coupling to the gate of said first field effect transistor, and
    said current mirror control circuit includes:
      a control voltage input circuit controlling a current value of a current directed from the drain of said first field effect transistor to said second power supply node in accordance with said control voltage, and having a current driving capability variable in accordance with said instruction signal;
      a first resistance circuit provided between said control voltage input circuit and said second power supply node; and
      a second resistance circuit provided between the gate of said first field effect transistor and said second power supply node.

14. The voltage controlled oscillation circuit according to claim 13, wherein
  said instruction signal has a plurality of switch control signals, and
  said control voltage input circuit includes:
    a plurality of field effect control transistors provided on a plurality of conductive paths between the drain of said first field effect transistor and said first resistance circuit, respectively, and each having a gate receiving said control voltage; and
    a plurality of switch circuits provided on said plurality of conductive paths, respectively, and controlled by raid plurality of switch control signals, respectively.

15. The voltage controlled oscillation circuit according to claim 13, wherein
  said instruction signal has a plurality of switch control signals, and
  said control voltage input circuit includes:
    a plurality of field effect control transistors provided in series on a conductive path between the drain of said first field effect transistor and said first resistance circuit, and each having a gate receiving said control voltage; and
    a plurality of switch circuits provided between a plurality of connection nodes connecting said plurality of field effect control transistors to one another and said first resistance circuit, respectively, and controlled by said plurality of switch control signals, respectively.

16. A voltage controlled oscillation circuit comprising:
a self-excited oscillation circuit oscillating with a frequency in accordance with a level of an operating current control signal, wherein said self-excited oscillation circuit includes
   a plurality of stages of inversion circuits connected in series to each other, and each having a field effect transistor as a switching element to operate with a current in accordance with said operating current control signal; and
an operating current control circuit generating said operating current control signal in accordance with a control voltage applied from an outside of said voltage controlled oscillation circuit, wherein said operating current control circuit includes:
   a current mirror circuit generating a constant current flowing from a first power supply node to a second power supply node, and outputting said operating current control signal in accordance with a value of said constant current; and
   a current mirror control circuit controlling the value of said constant current generated by said current mirror circuit in accordance with said control voltage, and changing a range, in which the value of said constant current is changed in response to a change of said control voltage, in accordance with an instruction signal applied from the outside of said voltage controlled oscillation circuit, wherein
said current mirror circuit includes:
   a first field effect transistor having a source coupling to said first power supply node, and having a gate and a drain coupling to each other; and
   a second field effect transistor having a source coupling to said first power supply node, and having a gate coupling to the gate of said first field effect transistor, and
said current mirror control circuit includes:
   a control voltage input circuit controlling a current value of a current directed from the drain of said first field effect transistor to said second power supply node in accordance with said control voltage, and having a current driving capability variable in accordance with said instruction signal;
   a first resistance circuit provided between said control voltage input circuit and said second power supply node; and
   a second resistance circuit provided between the gate of said first field effect transistor and said second power supply node, and having a resistance value variable in accordance with said instruction signal.

17. The voltage controlled oscillation circuit according to claim 16, wherein
said instruction signal has a plurality of switch control signals, and
said control voltage input circuit includes:
   a plurality of field effect control transistors provided on a plurality of conductive paths between the drain of said first field effect transistor and said first resistance circuit, respectively, and each having a gate receiving said control voltage; and
   a plurality of switch circuits provided on said plurality of conductive paths, respectively, and controlled by raid plurality of switch control signals, respectively.

18. The voltage controlled oscillation circuit according to claim 16, wherein
said instruction signal has a plurality of switch control signals, and
said control voltage input circuit includes:
   a plurality of field effect control transistors provided in series on a conductive path between the drain of said first field effect transistor and said first resistance circuit, and each having a gate receiving said control voltage; and
   a plurality of switch circuits provided between a plurality of connection nodes connecting said plurality of field effect control transistors to one another and said first resistance circuit, respectively, and controlled by said plurality of switch control signals, respectively.

19. The voltage controlled oscillation circuit according to claim 16, wherein
said instruction signal has a plurality of switch control signals, and
said second resistance circuit includes:
   a plurality of resistors provided on a plurality of conductive paths between the gate of said first field effect transistor and said second power supply node, respectively; and
   a plurality of switch circuits provided on said plurality of conductive paths, respectively, and controlled by said plurality of switch control signals, respectively.

20. The voltage controlled oscillation circuit according to claim 16, wherein
said instruction signal has a plurality of switch control signals, and
said second resistance circuit includes:
   a plurality of resistors provided in series on a conductive path between the gate of said first field effect transistor and said second power supply node; and
   a plurality of switch circuits provided between a plurality of connection nodes connecting said plurality of resistors to one another and said second power supply node, respectively, and controlled by said plurality of switch control signals, respectively.

* * * * *